US012069868B2

(12) United States Patent
Young et al.

(10) Patent No.: US 12,069,868 B2
(45) Date of Patent: Aug. 20, 2024

(54) GATED FERROELECTRIC MEMORY CELLS FOR MEMORY CELL ARRAY AND METHODS OF FORMING THE SAME

(71) Applicant: Taiwan Semiconductor Manufacturing Company Limited, Hsinchu (TW)

(72) Inventors: Bo-Feng Young, Taipei (TW); Sai-Hooi Yeong, Zhubei (TW); Han-Jong Chia, Hsinchu (TW); Sheng-Chen Wang, Hsinchu (TW); Yu-Ming Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 71 days.

(21) Appl. No.: 18/070,419

(22) Filed: Nov. 28, 2022

(65) Prior Publication Data

US 2023/0090306 A1    Mar. 23, 2023

Related U.S. Application Data

(63) Continuation of application No. 17/096,993, filed on Nov. 13, 2020, now Pat. No. 11,515,313.
(Continued)

(51) Int. Cl.
*H10B 53/30* (2023.01)
*H01L 29/66* (2006.01)
(Continued)

(52) U.S. Cl.
CPC ....... *H10B 53/30* (2023.02); *H01L 29/66666* (2013.01); *H01L 29/7827* (2013.01);
(Continued)

(58) Field of Classification Search
CPC ........ H10B 53/00; H10B 53/10; H10B 53/20; H10B 53/30; H01L 29/66666; H01L 29/7827; H01L 29/7831; H01L 29/7841
See application file for complete search history.

(56) References Cited

U.S. PATENT DOCUMENTS 8,213,226 B2 * 7/2012 Carman .............. H01L 29/7841
365/177
9,425,107 B2 * 8/2016 Matsubayashi ... H01L 29/78642
(Continued)

FOREIGN PATENT DOCUMENTS

CN     109768087 A  *  5/2019  ........ H01L 27/11556
CN     109768087 A       5/2019
(Continued)

OTHER PUBLICATIONS

Korean Patent and Trademark Office; KR Application No. 1020210075665; Notice of Allowance dated Aug. 16, 2023; 8 pages.
(Continued)

*Primary Examiner* — Matthew E Warren
(74) *Attorney, Agent, or Firm* — The Marbury Law Group, PLLC

(57) ABSTRACT

A gated ferroelectric memory cell includes a dielectric material layer disposed over a substrate, a metallic bottom electrode, a ferroelectric dielectric layer contacting a top surface of the bottom electrode, a pillar semiconductor channel overlying the ferroelectric dielectric layer and capacitively coupled to the metallic bottom electrode through the ferroelectric dielectric layer, a gate dielectric layer including a horizontal gate dielectric portion overlying the ferroelectric dielectric layer and a tubular gate dielectric portion laterally surrounding the pillar semiconductor channel, a gate electrode strip overlying the horizontal gate dielectric portion and laterally surrounding the tubular gate
(Continued)

dielectric portion and a metallic top electrode contacting a top surface of the pillar semiconductor channel.

20 Claims, 23 Drawing Sheets

Related U.S. Application Data

(60) Provisional application No. 63/042,025, filed on Jun. 22, 2020.

(51) Int. Cl.
    *H01L 29/78*     (2006.01)
    *H10B 53/00*     (2023.01)
    *H10B 53/20*     (2023.01)

(52) U.S. Cl.
    CPC ...... *H01L 29/7831* (2013.01); *H01L 29/7841* (2013.01); *H10B 53/00* (2023.02); *H10B 53/20* (2023.02)

(56) References Cited

U.S. PATENT DOCUMENTS

| | | | |
|---|---|---|---|
| 9,780,100 B1 * | 10/2017 | Balakrishnan | H10B 43/27 |
| 11,355,381 B2 * | 6/2022 | Or-Bach | H01L 21/743 |
| 2014/0124728 A1 * | 5/2014 | Kim | H10B 63/80 |
| | | | 438/238 |
| 2018/0182849 A1 * | 6/2018 | Alian | H01L 21/02107 |
| 2020/0066916 A1 | 2/2020 | Chen et al. | |
| 2020/0321277 A1 | 10/2020 | Yen et al. | |
| 2021/0375990 A1 * | 12/2021 | Young | H01L 29/78642 |

FOREIGN PATENT DOCUMENTS

| | | |
|---|---|---|
| KR | 20020076460 A | 10/2002 |
| KR | 20160002306 A | 1/2016 |
| KR | 20200036951 A | 4/2020 |
| TW | 201933613 A | 8/2019 |
| TW | 202010111 A | 3/2020 |
| WO | 2020044560 A1 | 3/2020 |
| WO | WO-2020044560 A1 * | 3/2020 ......... H01L 23/5223 |

OTHER PUBLICATIONS

Korean Patent and Trademark Office; KR Application No. 1020210075665; Request for Submission of an Opinion dated Oct. 18, 2022; 17 pages.
Korean Patent and Trademark Office; KR Application No. 1020210003439; 2nd Office Action dated Jul. 31, 2023; 5 pages.
Taiwan Patent and Trademark Office, Application No. 110134153 Office Action dated Dec. 27, 2021, 3 pages.

* cited by examiner

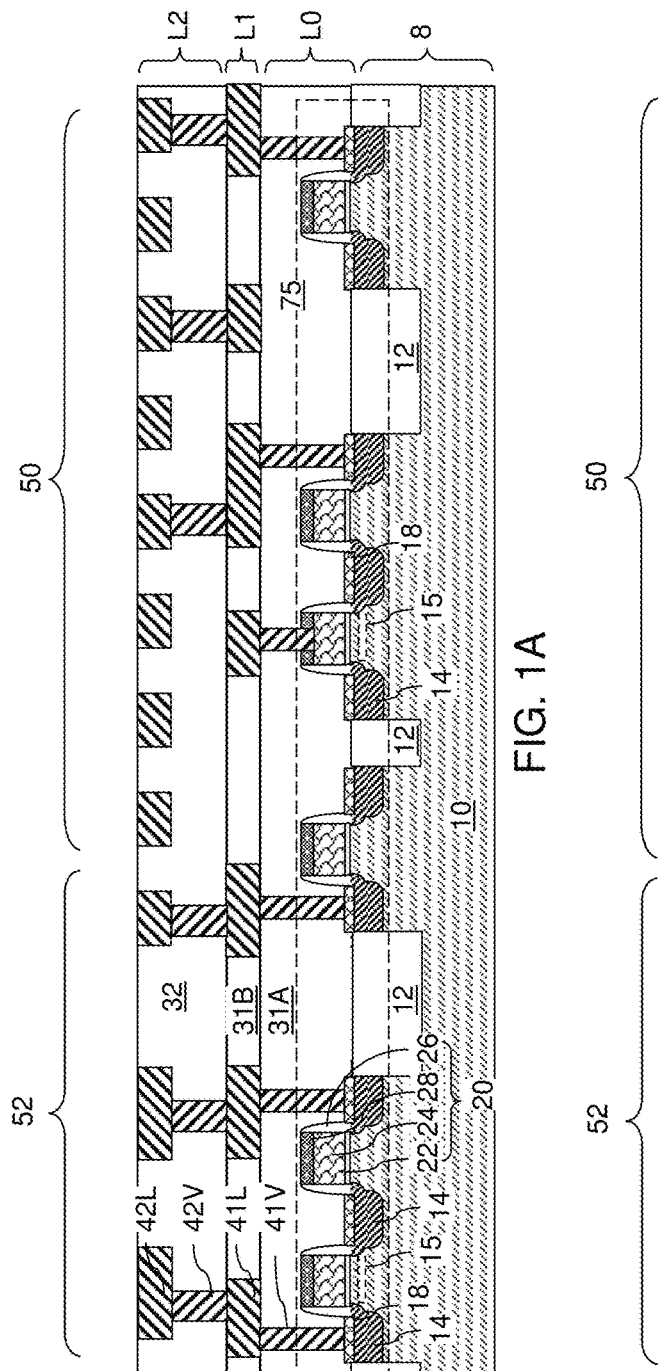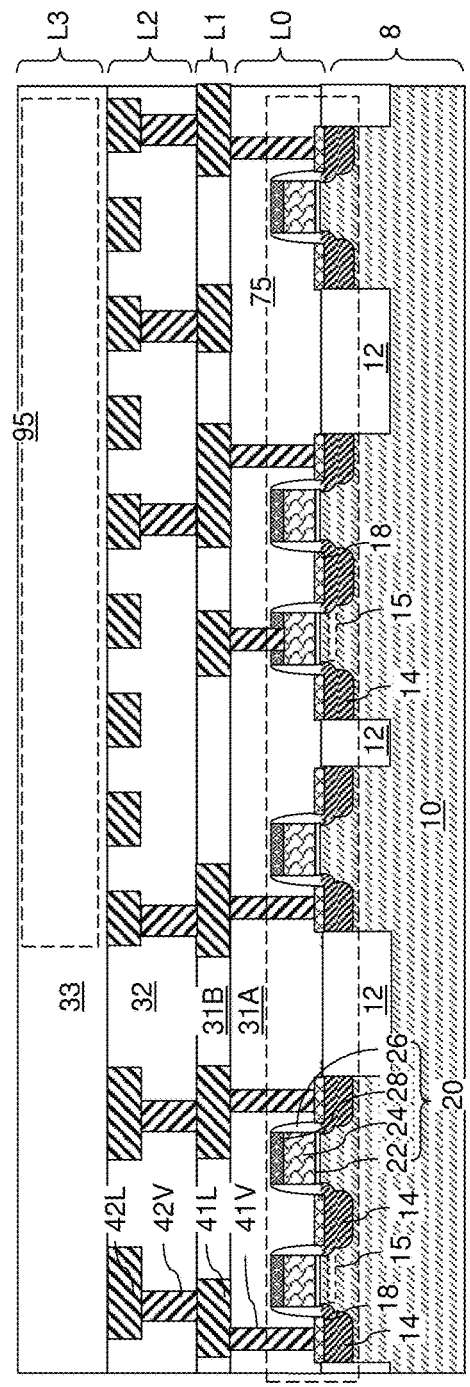

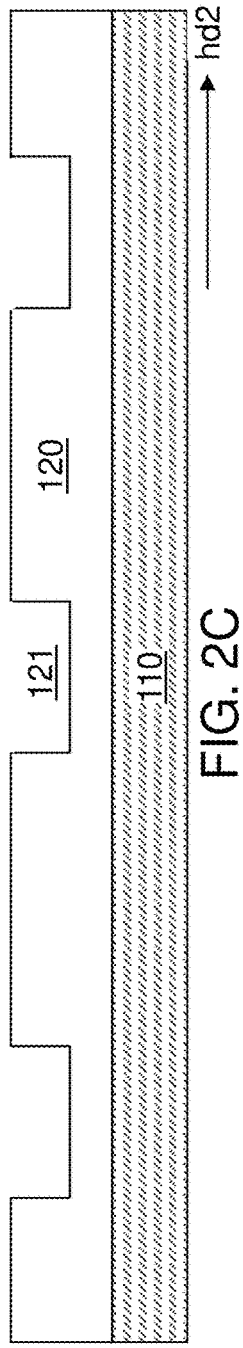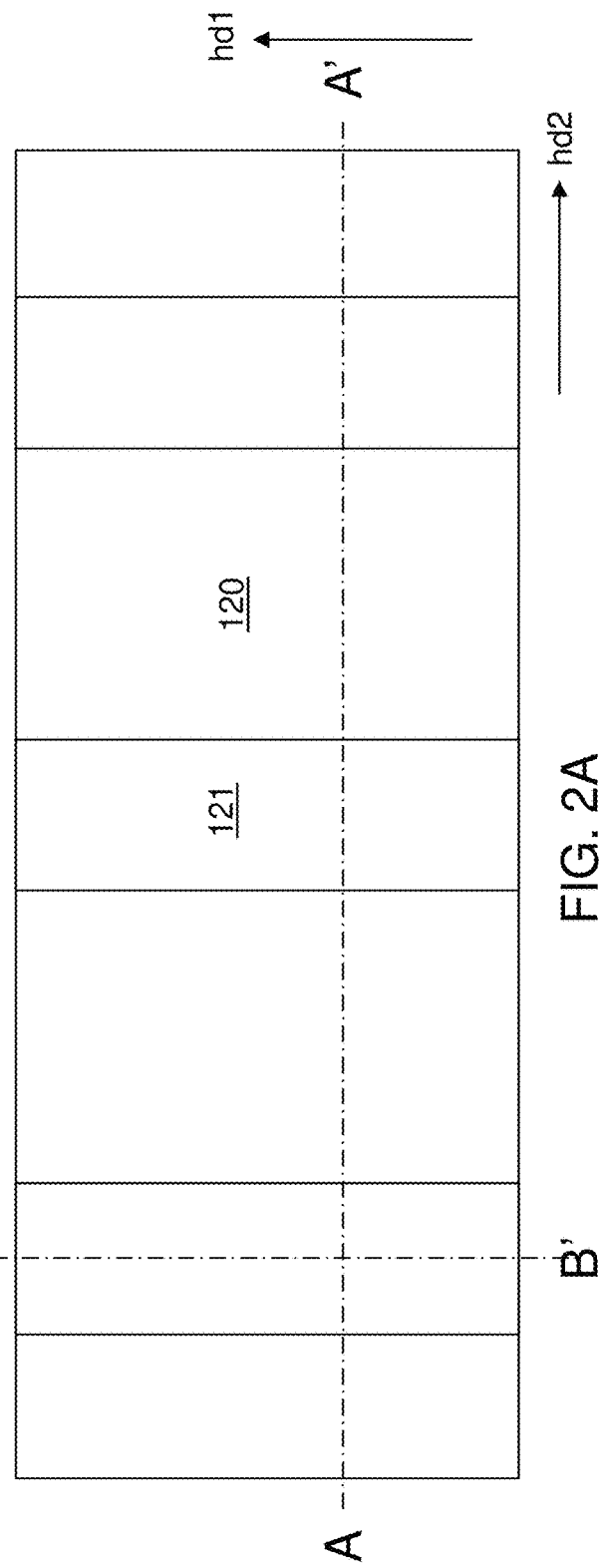

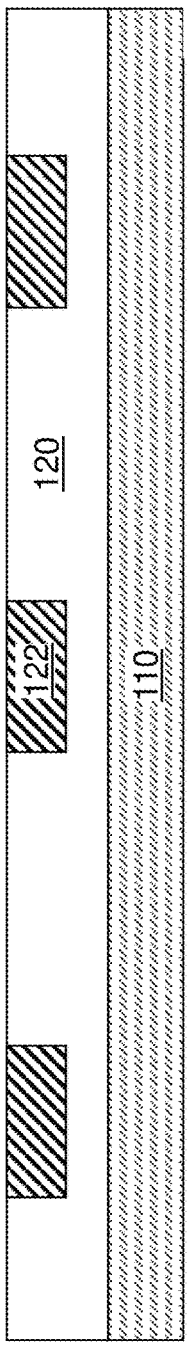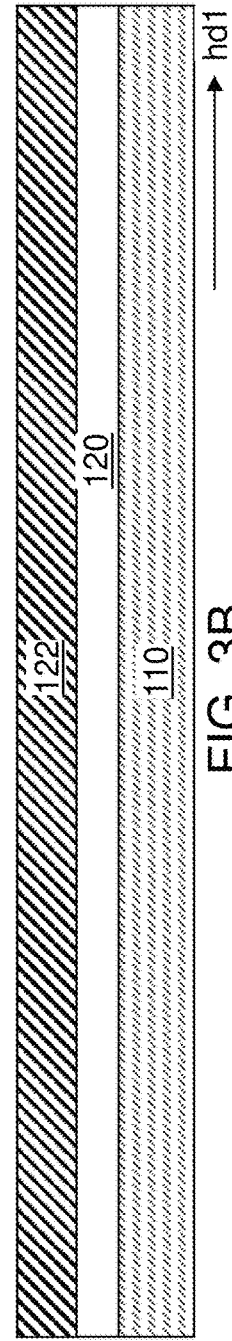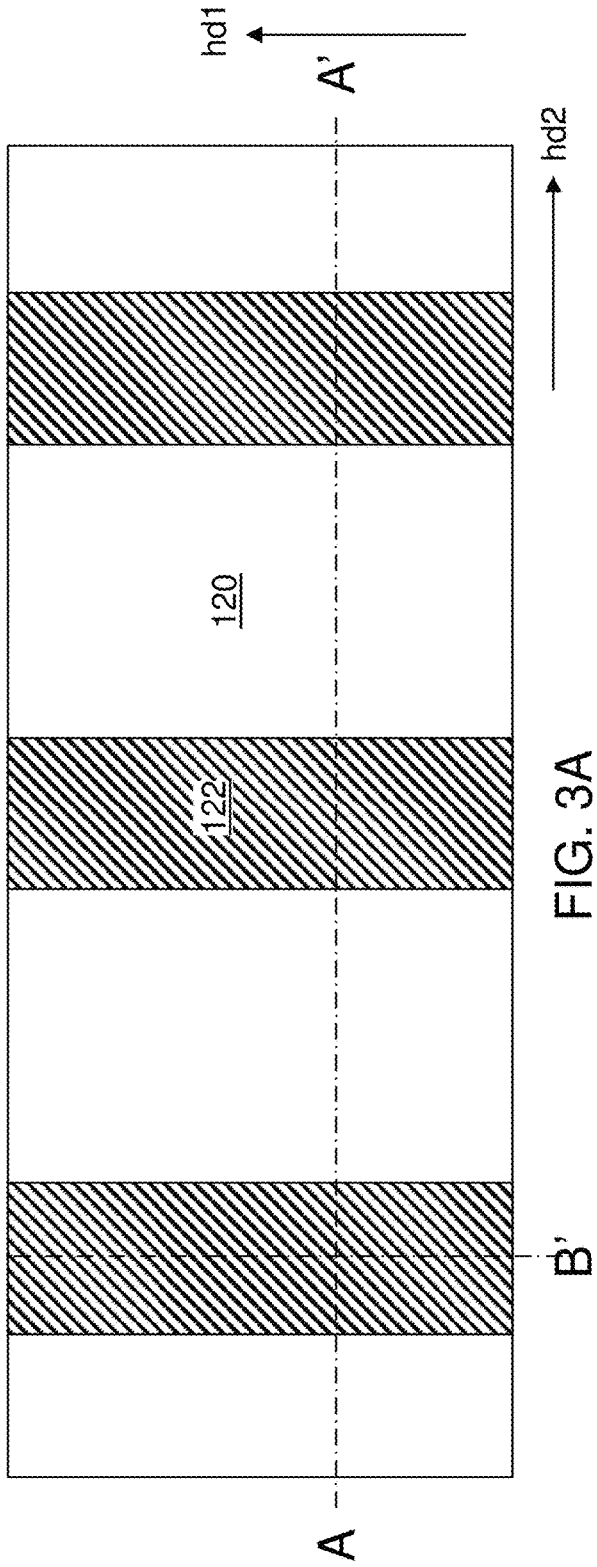

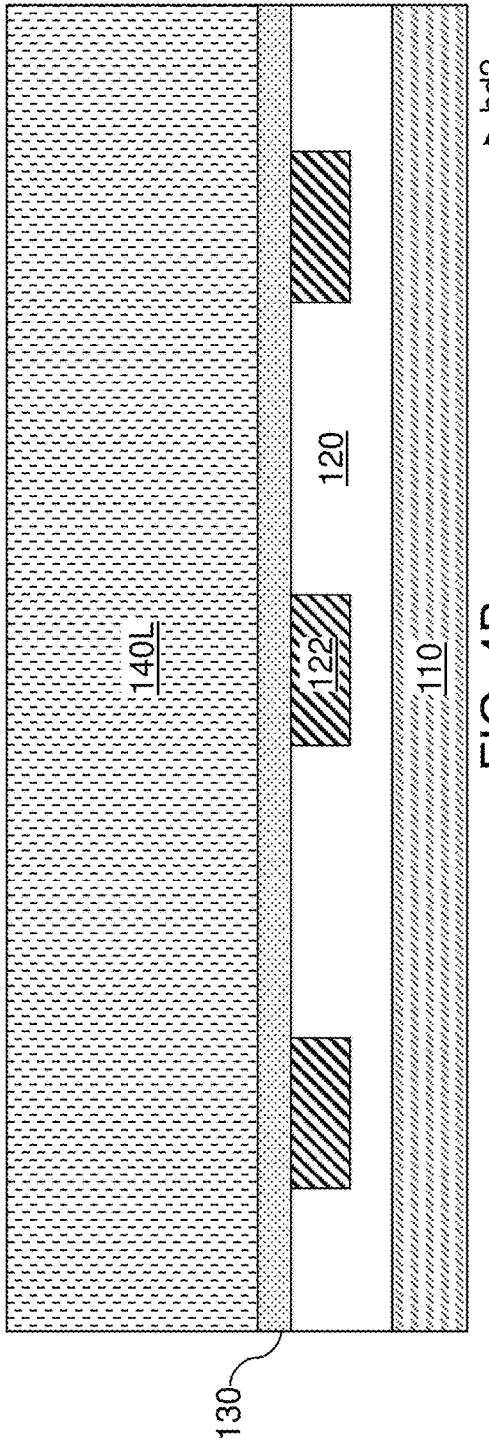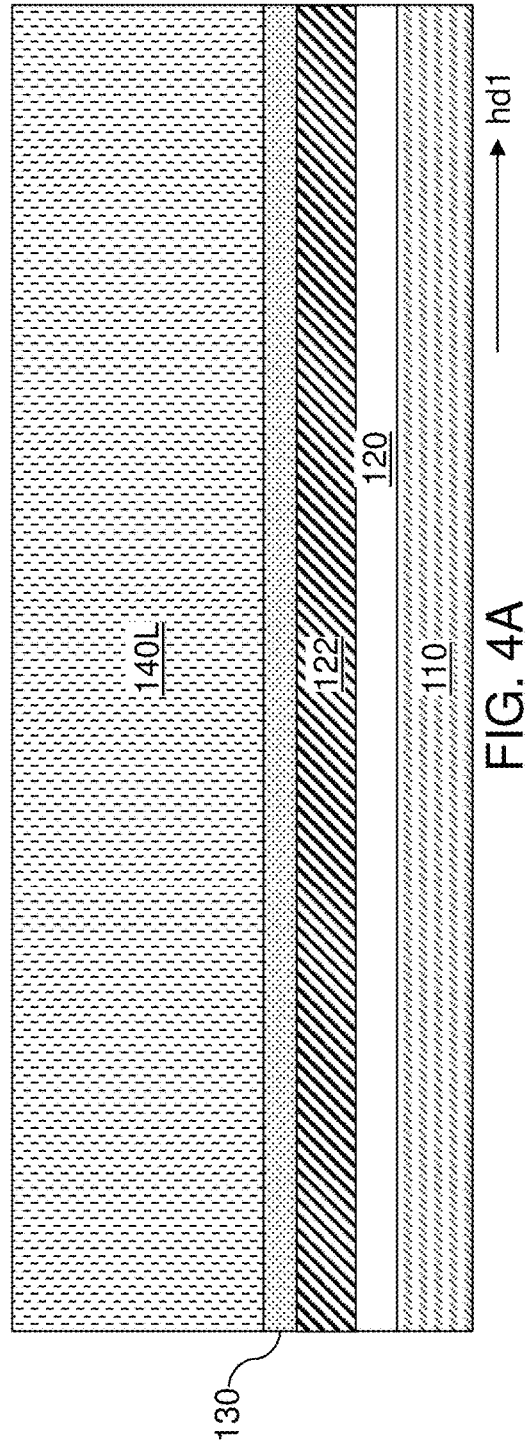

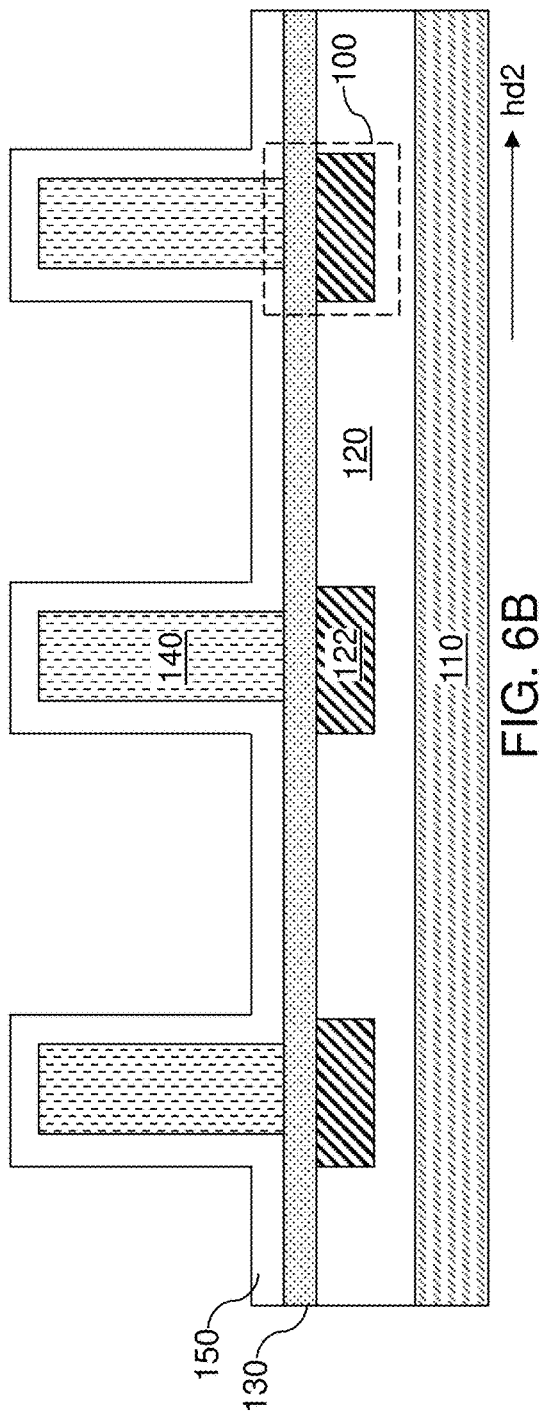
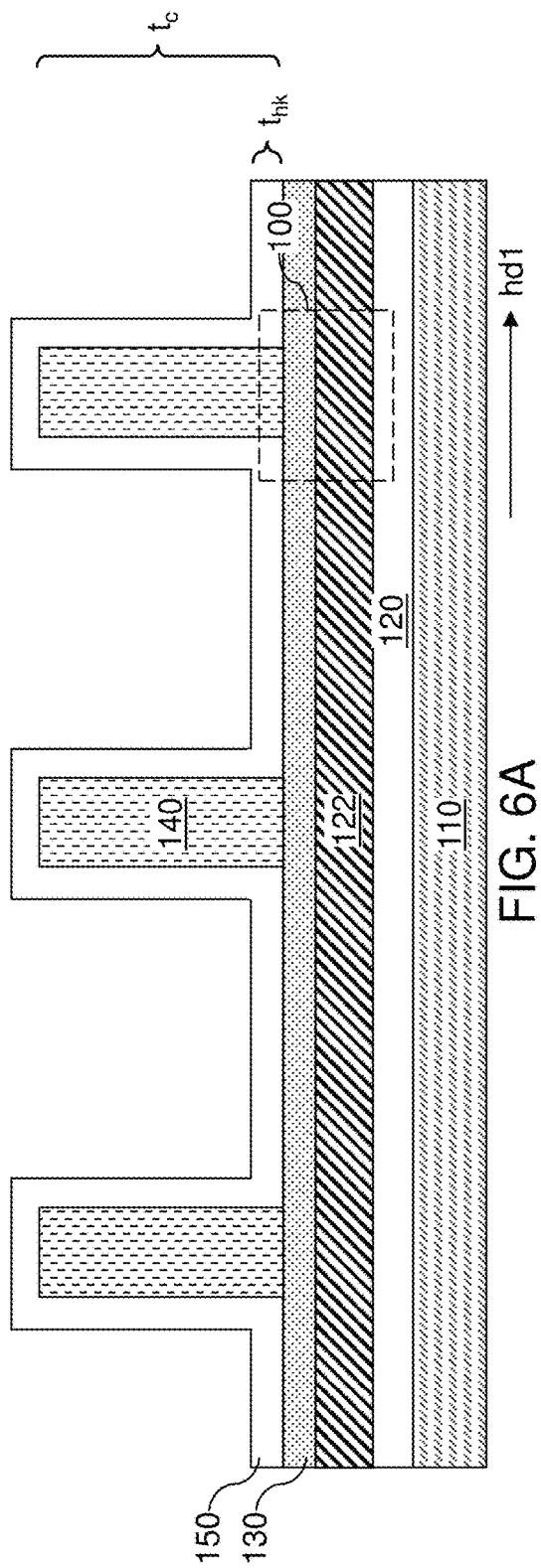

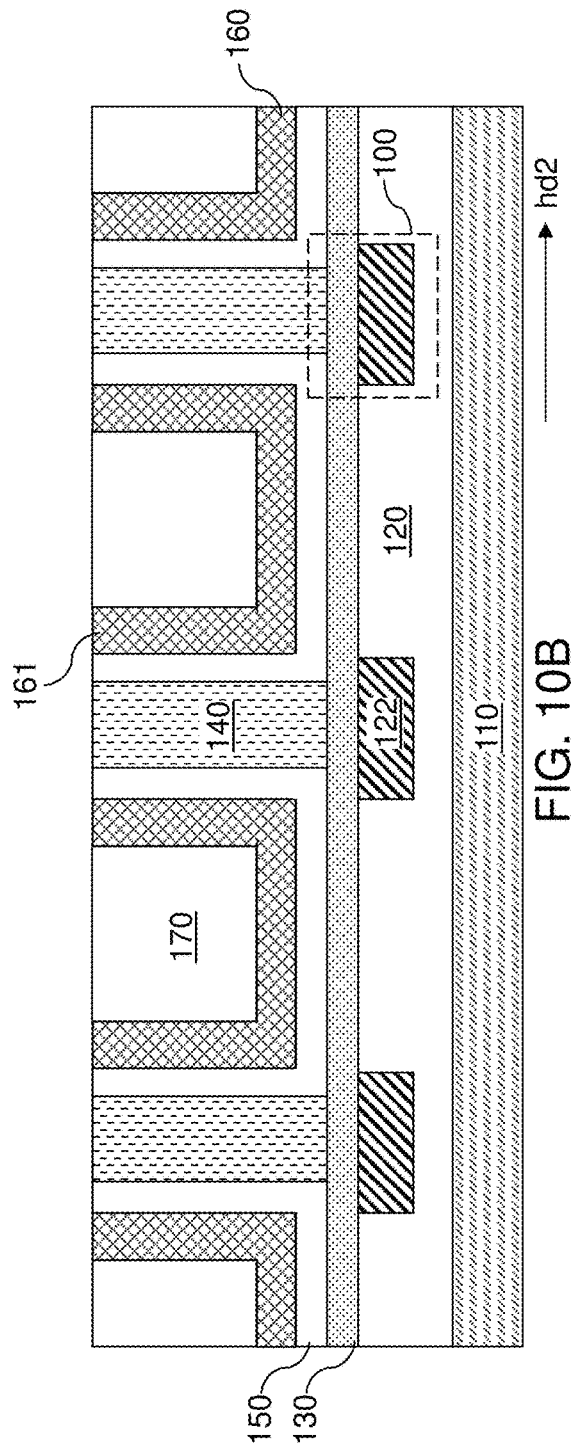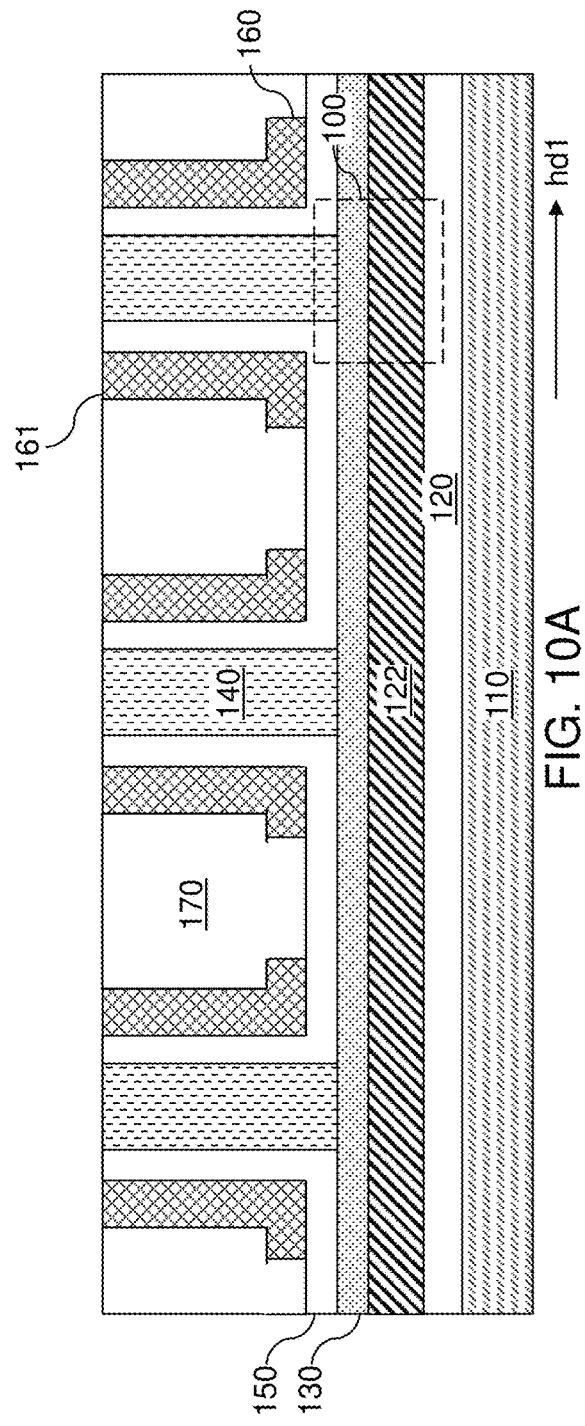
FIG. 10A
FIG. 10B

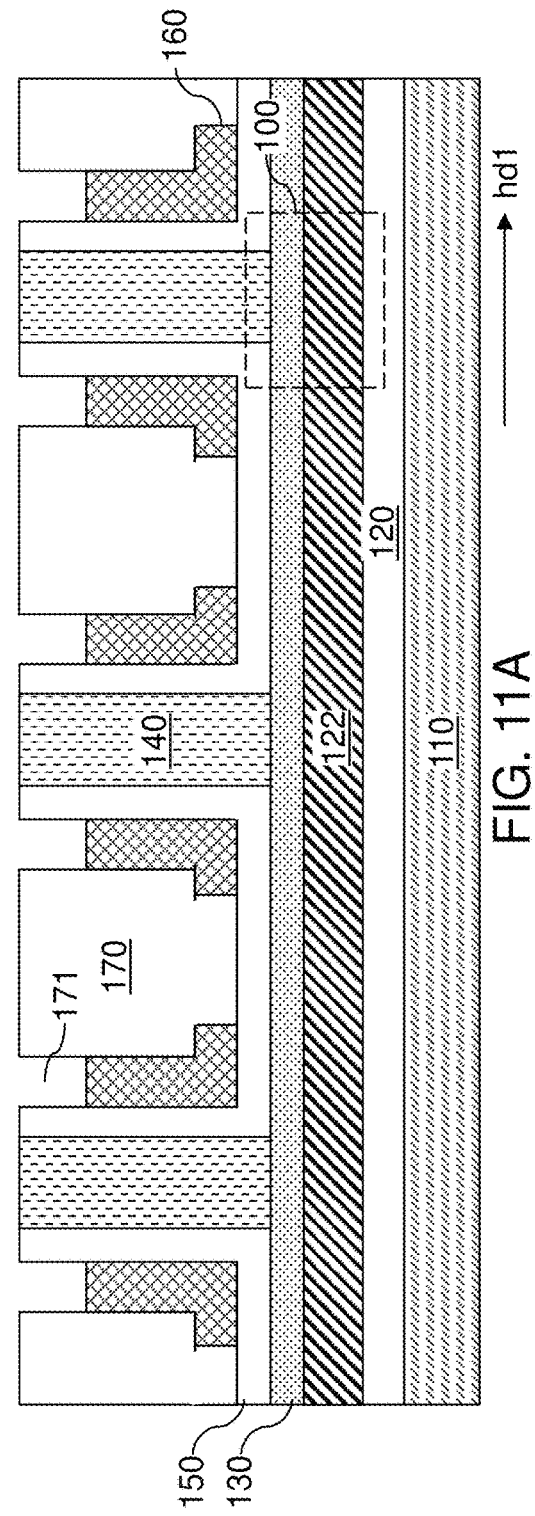
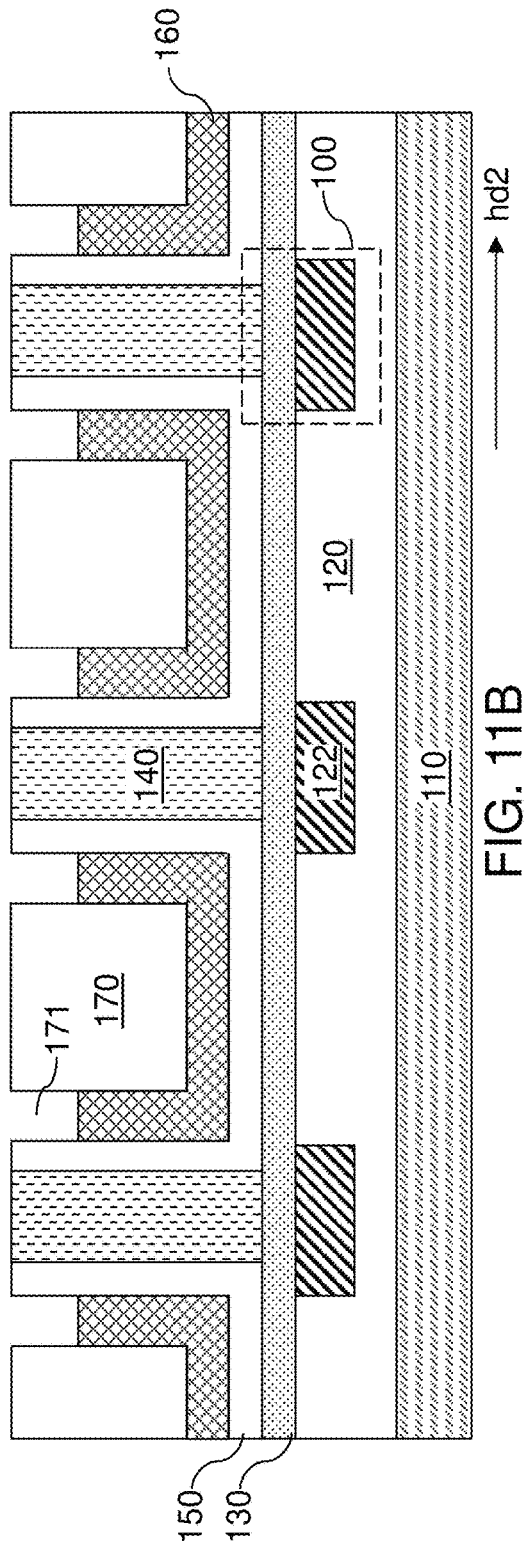
FIG. 11A
FIG. 11B

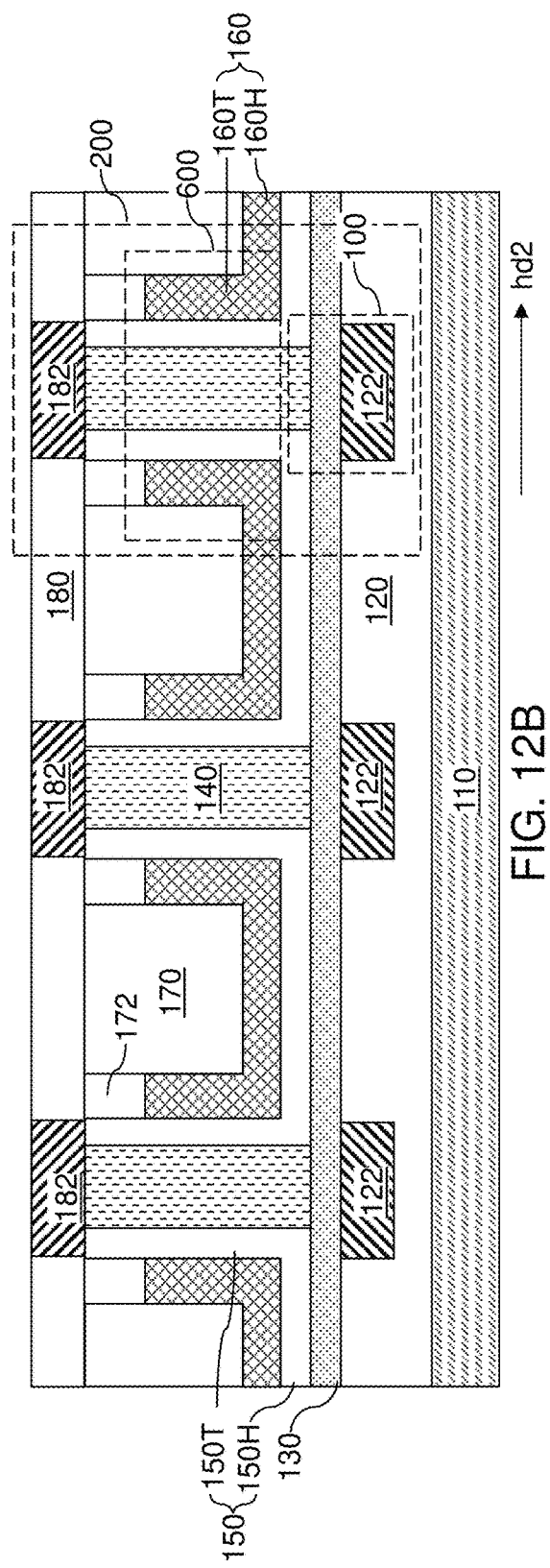
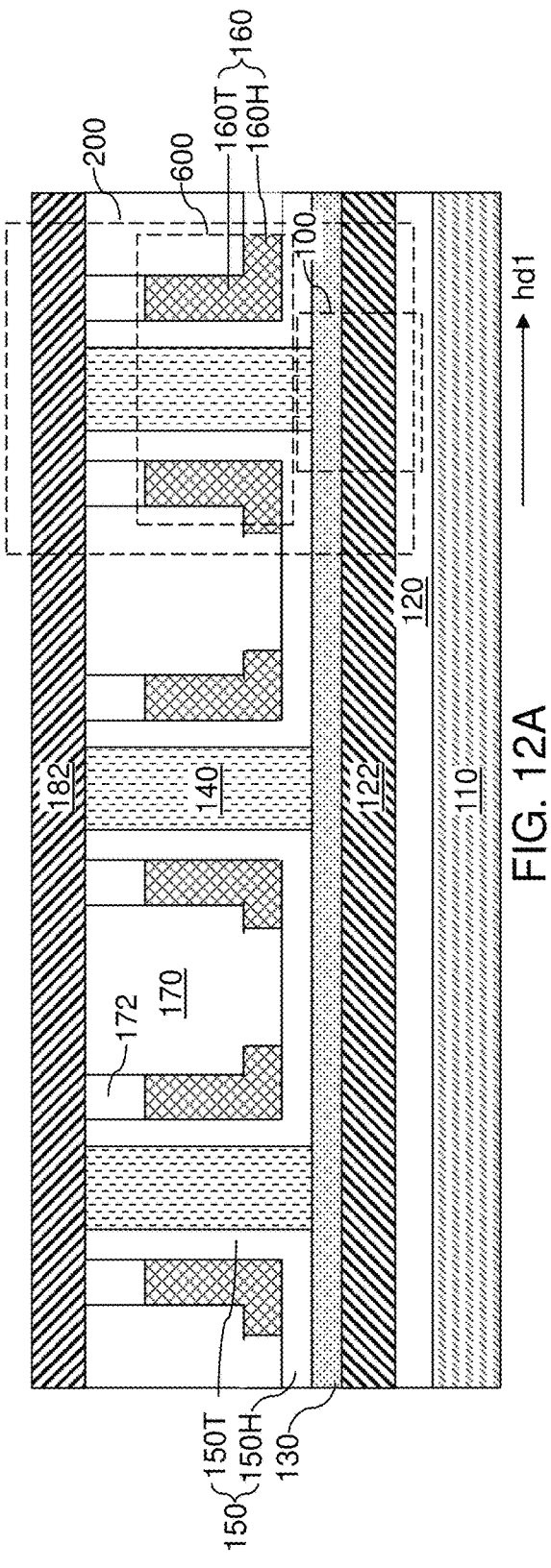

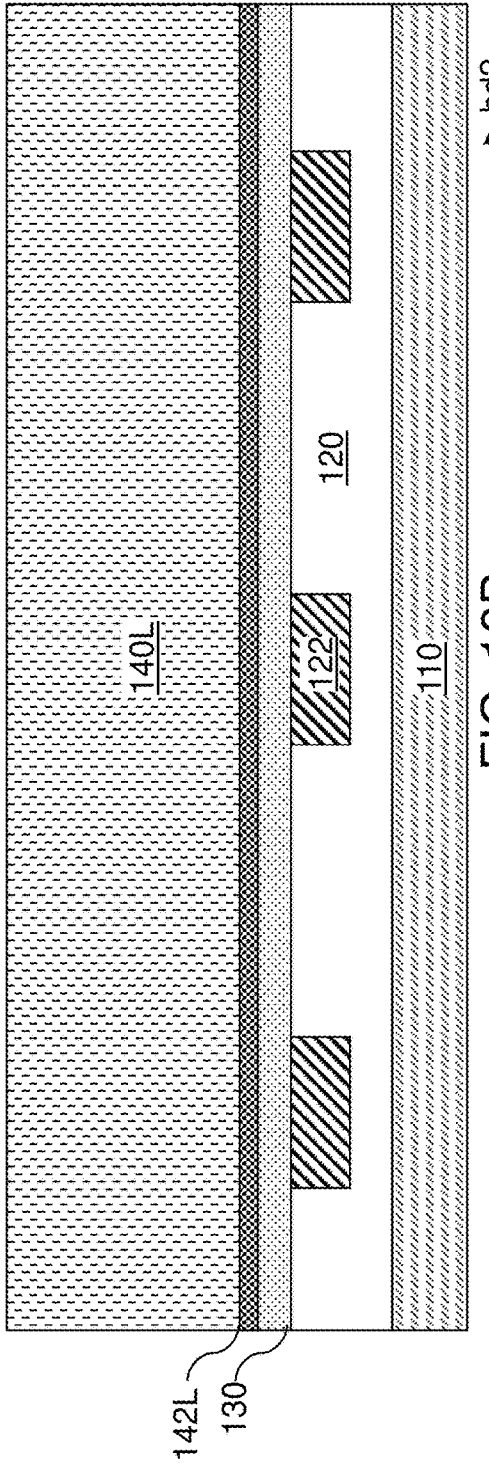
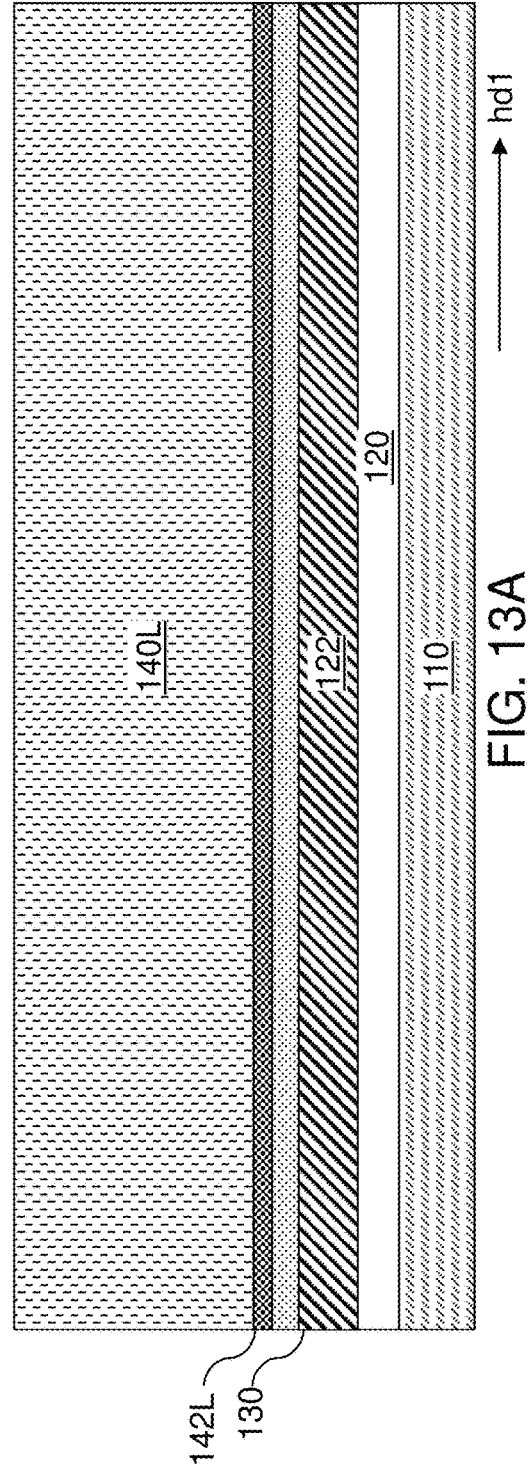
FIG. 13B
FIG. 13A

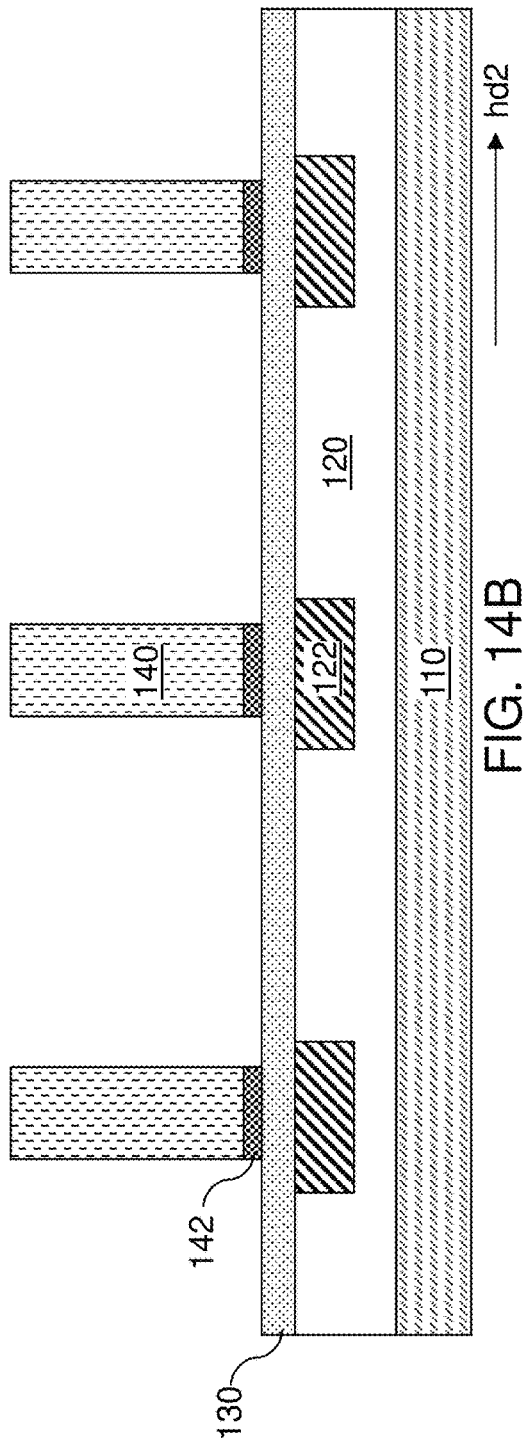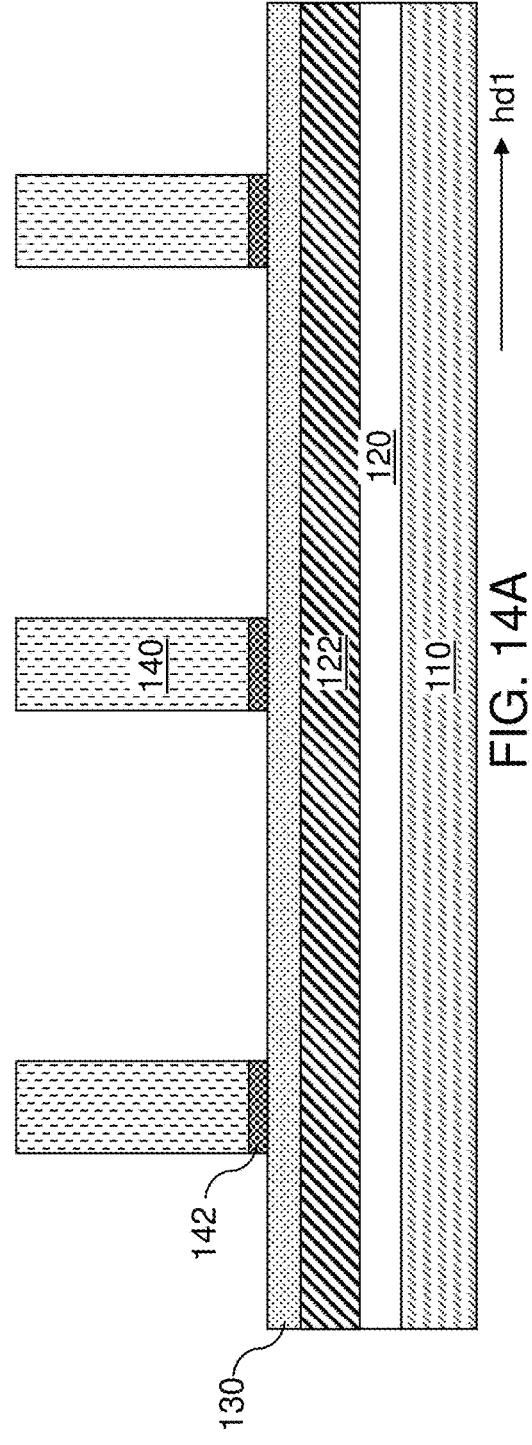

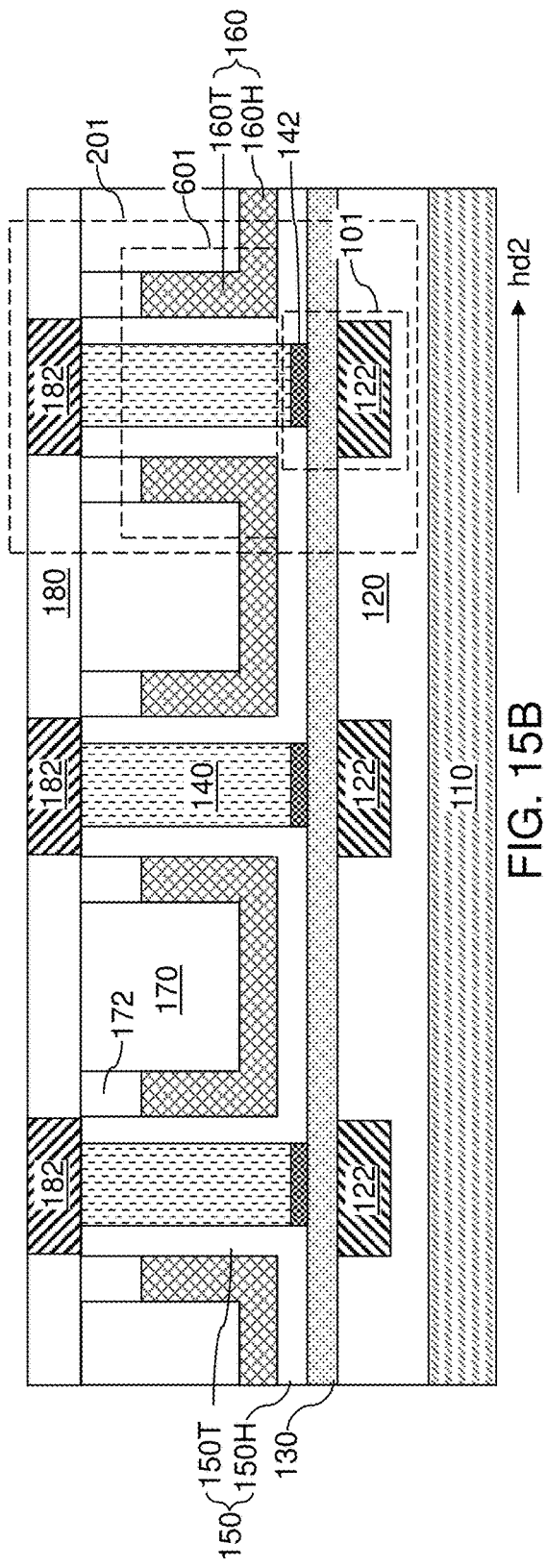
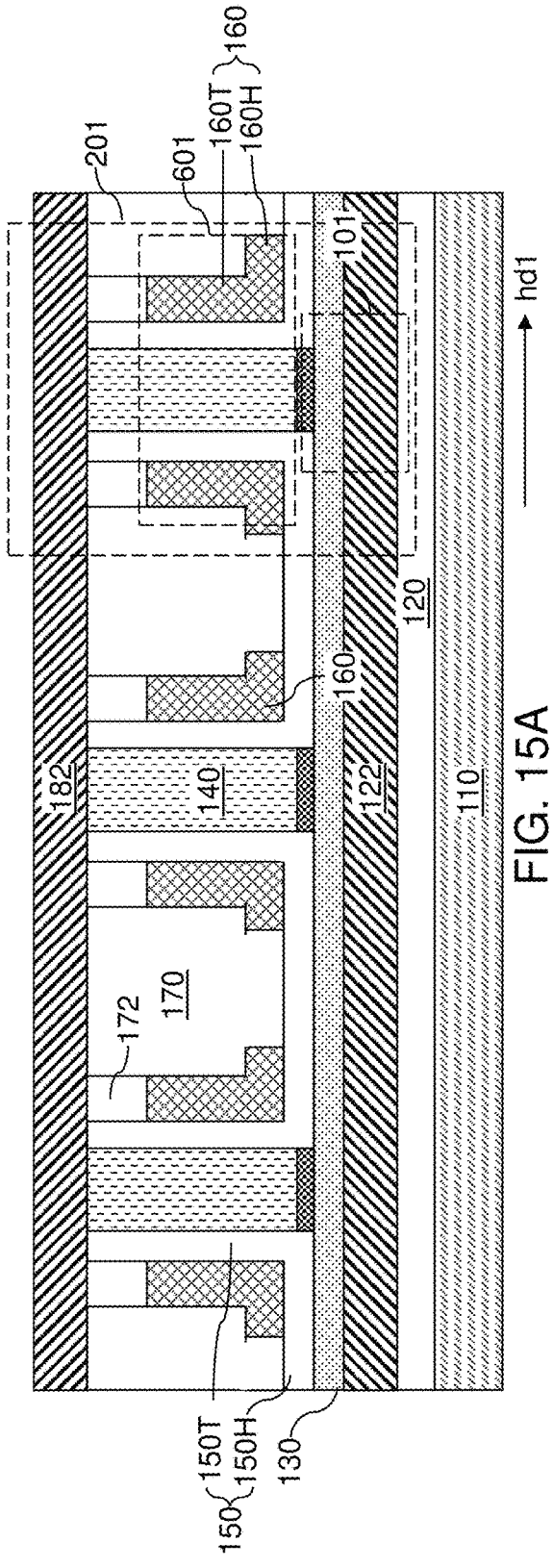
FIG. 15A
FIG. 15B

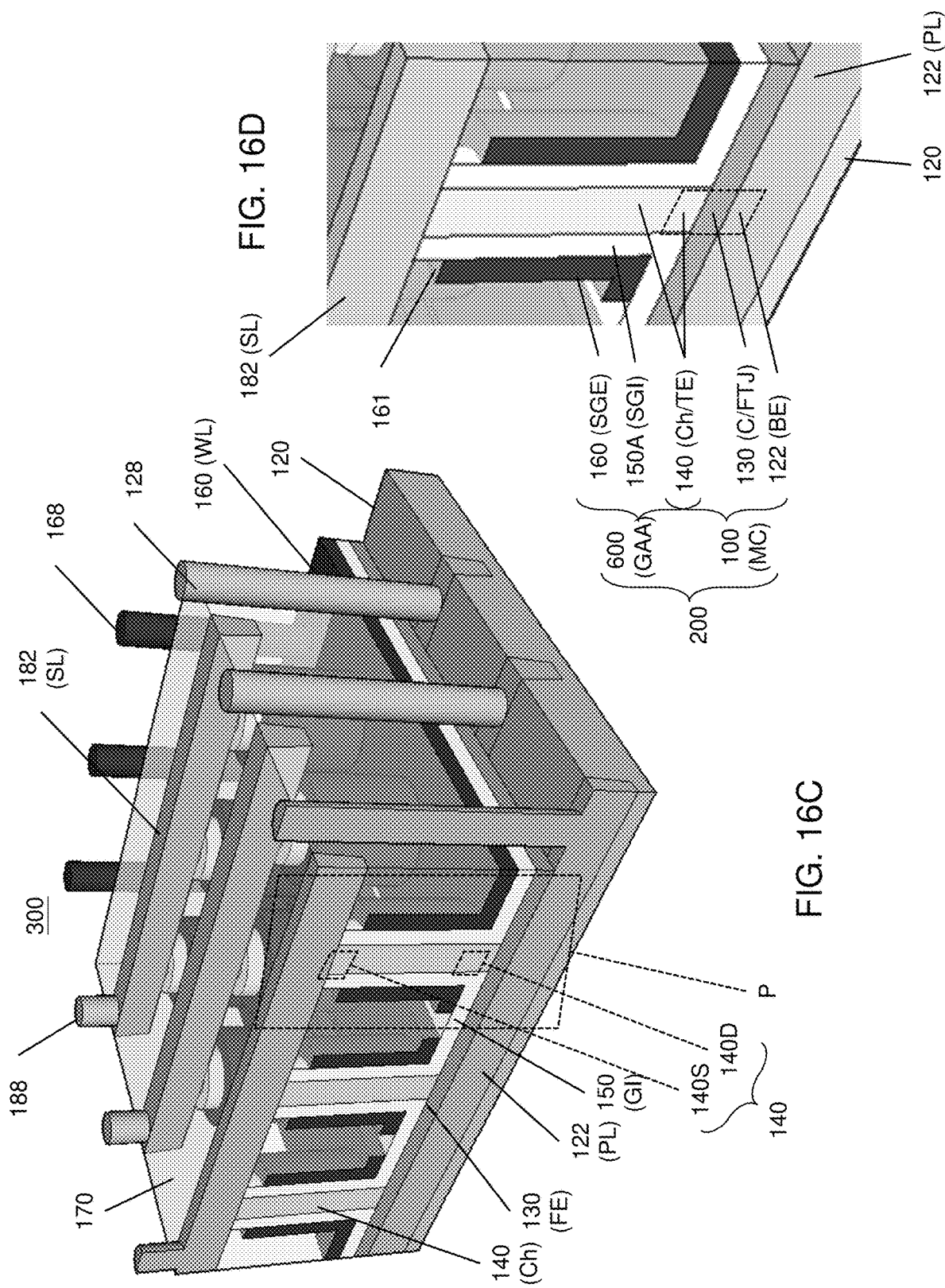

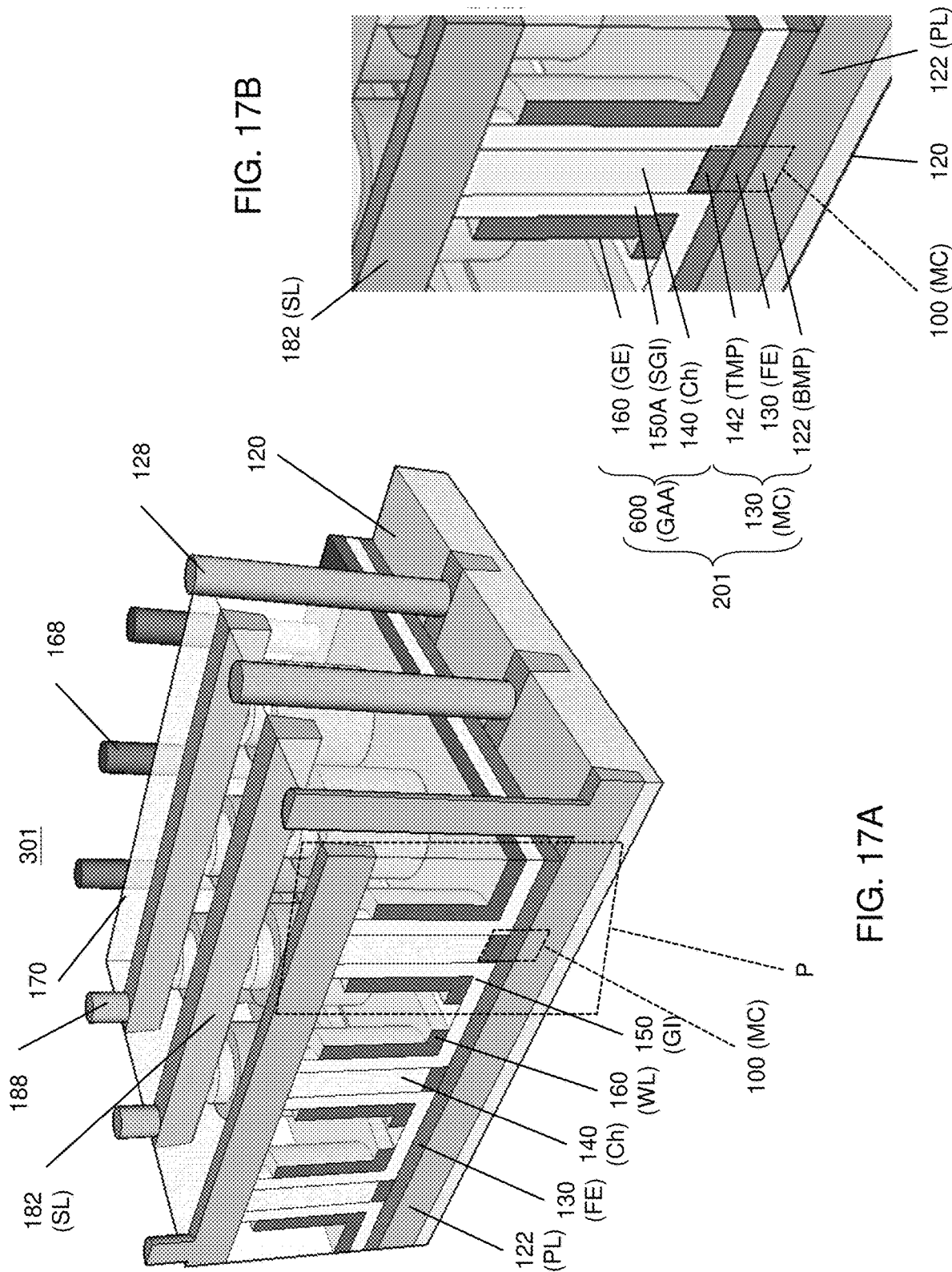

GATED FERROELECTRIC MEMORY CELLS FOR MEMORY CELL ARRAY AND METHODS OF FORMING THE SAME

RELATED APPLICATIONS

This application is a continuation of U.S. patent application Ser. No. 17/096,993 entitled "Gated Ferroelectric Memory Cells for Memory Cell Array and Methods of Forming the Same" filed on Nov. 13, 2020, which claims priority to U.S. Provisional Patent Application No. 63/042,025 entitled "Semiconductor Structure and Method of Forming the Same" filed on Jun. 22, 2020, the entire contents of both of which are hereby incorporated by reference for all purposes.

BACKGROUND

A ferroelectric material refers to a material that can maintain electrical polarization in the absence of external electrical field. The electrical polarization in a ferroelectric material has a hysteresis effect, enabling encoding of a data bit as a polarization direction within the ferroelectric material. In a ferroelectric tunnel junction device, a change in the direction of polarization causes a change in tunneling resistance, which can be employed to measure the direction of the electrical polarization and extract the value of the data bit stored in the ferroelectric tunnel junction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-sectional view of an exemplary structure after formation of complementary metal-oxide-semiconductor (CMOS) transistors, metal interconnect structures embedded in dielectric material layers, and a connection-via-level dielectric material layer according to an embodiment of the present disclosure.

FIG. 1B is a vertical cross-sectional view of the first exemplary structure during formation of the array of fin back gate field effect transistors according to an embodiment of the present disclosure.

FIG. 2A is a horizontal cross-sectional view of the exemplary structure after etching and patterning first metal line trenches in the first dielectric material layer according to an embodiment of the present disclosure.

FIG. 2B is a vertical cross-sectional view of the exemplary structure along the plane B-B' of FIG. 2A.

FIG. 2C is a vertical cross-sectional view of the exemplary structure along the plane A-A' of FIG. 2A.

FIG. 3A is a horizontal cross-sectional view of the exemplary structure after depositing and planarizing a conductive metal material in the first metal line trench to form first metal lines according to an embodiment of the present disclosure.

FIG. 3B is a vertical cross-sectional view of the exemplary structure along the plane B-B' of FIG. 3A.

FIG. 3C is a vertical cross-sectional view of the exemplary structure along the plane A-A' of FIG. 3A.

FIG. 4A is a vertical cross-sectional view of the exemplary structure along a first horizontal direction hd1 (i.e., plane B-B') after depositing a number of layers including a ferroelectric dielectric layer and a semiconductor channel material layer over the first metal lines and substrate according to an embodiment of the present disclosure.

FIG. 4B is a vertical cross-sectional view of the exemplary structure along a second horizontal direction hd2 (i.e., plane A-A') after depositing a number of layers including a ferroelectric dielectric layer and a semiconductor channel material layer over the first metal lines and substrate according to an embodiment of the present disclosure.

FIG. 6A is a vertical cross-sectional view of the exemplary structure along a first horizontal direction hd1 (i.e., plane B-B') after depositing a gate dielectric layer over the formed pillar semiconductor channels of the gated ferroelectric memory cell according to an embodiment of the present disclosure.

FIG. 6B is a vertical cross-sectional view of the exemplary structure along a second horizontal direction hd2 (i.e., plane A-A') after depositing a gate dielectric layer over the formed pillar semiconductor channels of the gated ferroelectric memory cell according to an embodiment of the present disclosure.

FIG. 10A is a vertical cross-sectional view of the exemplary structure along a first horizontal direction hd1 (i.e., plane B-B') after planarizing the conductive metal material layer, gate dielectric layer and pillar semiconductor channels of the gated ferroelectric memory cell according to an embodiment of the present disclosure.

FIG. 10B is a vertical cross-sectional view of the exemplary structure along a second horizontal direction hd2 (i.e., plane A-A') after planarizing the conductive metal material layer, gate dielectric layer and pillar semiconductor channels of the gated ferroelectric memory cell according to an embodiment of the present disclosure.

FIG. 11A is a vertical cross-sectional view of the exemplary structure along a first horizontal direction hd1 (i.e., plane B-B') after a selective etch process to vertically recess a top annular portion of the gate electrode strip of the field-controlled vertical current switch according to an embodiment of the present disclosure.

FIG. 11B is a vertical cross-sectional view of the exemplary structure along a second horizontal direction hd2 (i.e., plane A-A') after a selective etch process to vertically recess a top annular portion of the gate electrode strip of the field-controlled vertical current switch according to an embodiment of the present disclosure.

FIG. 12A is a vertical cross-sectional view of the exemplary structure along a first horizontal direction hd1 (i.e., plane B-B') after deposition of a conductive metal material to form a bit line of the field-controlled vertical current switch according to an embodiment of the present disclosure.

FIG. 12B is a vertical cross-sectional view of the exemplary structure along a second horizontal direction hd2 (i.e., plane A-A') after deposition of a conductive metal material to form a bit line of the field-controlled vertical current switch according to an embodiment of the present disclosure.

FIG. 13A is a vertical cross-sectional view of a second alternative embodiment structure along a first horizontal direction hd1 (i.e., plane B-B') after depositing a number of layers including a ferroelectric dielectric layer, a metal top electrode layer and a semiconductor channel material layer over the first metal lines and substrate according to an embodiment of the present disclosure.

FIG. 13B is a vertical cross-sectional view of the second alternative embodiment structure along a second horizontal direction hd2 (i.e., plane A-A') after depositing a number of layers including a ferroelectric dielectric layer, a metal top electrode layer and a semiconductor channel material layer over the first metal lines and substrate according to an embodiment of the present disclosure.

FIG. 14A is a vertical cross-sectional view of the second alternative embodiment structure along a first horizontal direction hd1 (i.e., plane B-B') after etching and patterning pillar semiconductor channels of a gated ferroelectric memory cell according to an embodiment of the present disclosure.

FIG. 14B is a vertical cross-sectional view of the second alternative embodiment structure along a second horizontal direction hd2 (i.e., plane A-A') after etching and patterning pillar semiconductor channels of a gated ferroelectric memory cell according to an embodiment of the present disclosure.

FIG. 15A is a vertical cross-sectional view of the second alternative embodiment structure along a first horizontal direction hd1 (i.e., plane B-B') after deposition of a conductive metal material to form a bit line of the field-controlled vertical current switch according to an embodiment of the present disclosure.

FIG. 15B is a vertical cross-sectional view of the second alternative embodiment structure along a second horizontal direction hd2 (i.e., plane A-A') after deposition of a conductive metal material to form a bit line of the field-controlled vertical current switch according to an embodiment of the present disclosure.

FIG. 16C is a cross-sectional partial perspective view of the exemplary semiconductor memory device of FIG. 16A, taken through memory structures of the semiconductor memory device.

FIG. 16D is an enlarged cross-sectional view of a portion P of FIG. 16C.

FIG. 17A is a vertical partial cross-sectional perspective view of a semiconductor memory device according to a second embodiment of the present disclosure.

FIG. 17B is an enlarged cross-sectional view of a portion P of FIG. 17A.

DETAILED DESCRIPTION

Figure 1C:
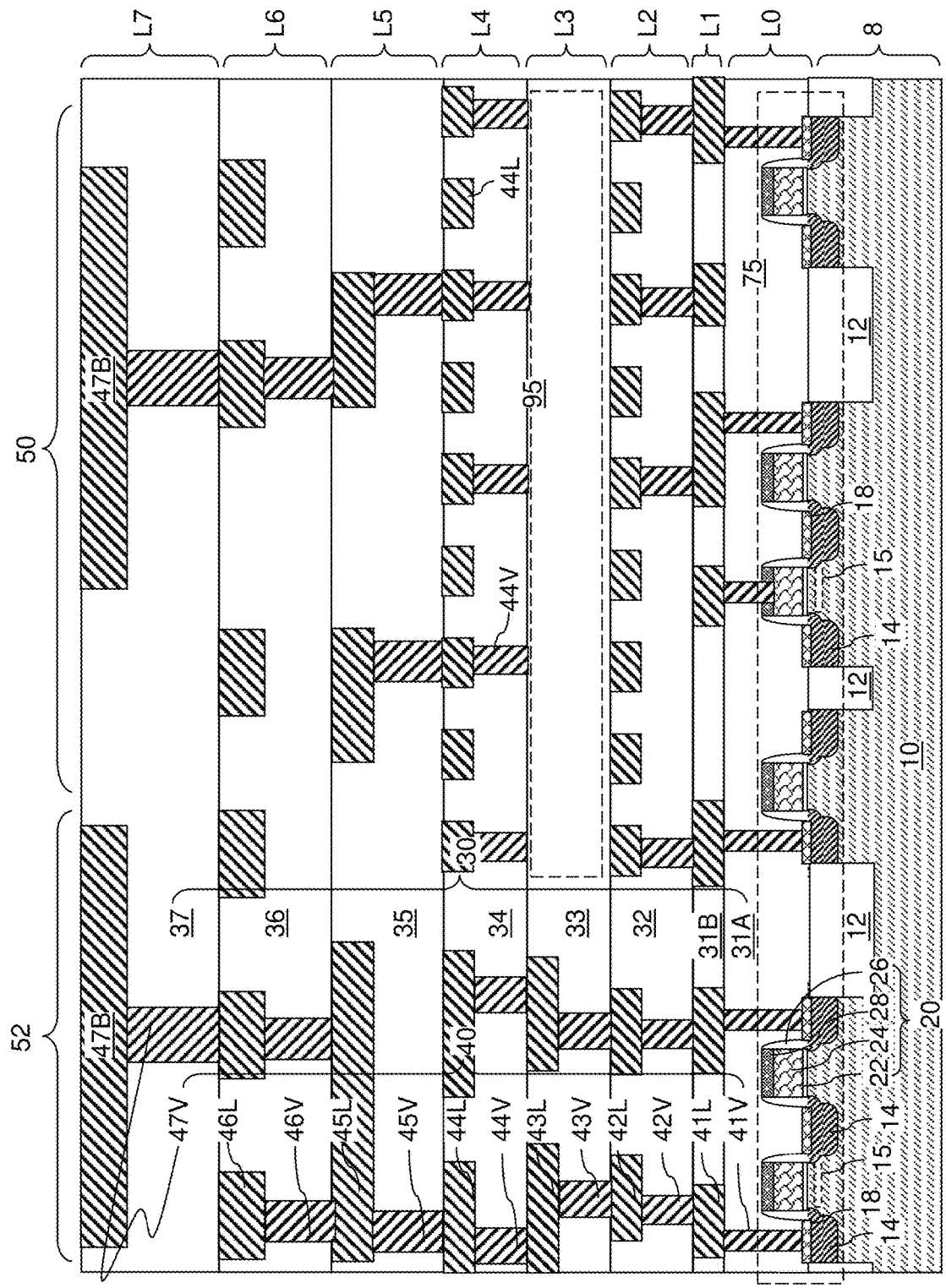
FIG. 1C is a vertical cross-sectional view of the first exemplary structure after formation of upper-level metal interconnect structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and specifically to a vertical field-controlled current selector switch that may operate in conjunction with a memory cell device as a memory cell selector device. Various embodiments of the present disclosure may be directed to a gated ferroelectric memory device and methods of forming the same.

Memory devices include a grid of independently functioning memory cells formed on a substrate. Memory devices may include volatile memory cells or nonvolatile (NV) memory cells. Emerging memory technologies seek to store more data at less cost than the expensive-to-build silicon chips used by popular consumer electronics. Such emerging memory devices may be used to replace existing memory technologies such as flash memory in near future. While existing resistive random-access memories have generally been adequate for their intended purposes, as device scaling-down continues, they have not been entirely satisfactory in all respects. Emerging nonvolatile memory technologies may include resistive random-access memory (RRAM or ReRAM), magneto-resistive random-access memory (MRAM), ferroelectric random-access memory (FeRAM), and phase-change memory (PCM), for example.

RRAM is a type of NV RAM that works by changing the resistance across a dielectric solid-state material, often referred to as a memristor. MRAM is a type of NV RAM that stores data in magnetic domains. Unlike conventional RAM chip technologies, data in MRAM is not stored as electric charge or current flows, but by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. If the insulating layer is thin enough (typically a few nanometers), electrons can tunnel from one ferromagnet into the other. This configuration is known as a magnetic tunnel junction (MTJ) and is the simplest structure for an MRAM bit.

Ferroelectric RAM (FeRAM, F-RAM or FRAM) is a random-access memory similar in construction to dynamic RAM (DRAM) but uses a ferroelectric dielectric layer instead of a dielectric material layer to achieve non-volatility. Phase-change memory (also known as PCM, PCME, PRAM, PCRAM, OUM (ovonic unified memory) and C-RAM or CRAM (chalcogenide RAM)) is a type of NV RAM. PRAMs exploit the unique behavior of chalcogenide glass. In the older generation of PCM, heat produced by the passage of an electric current through a heating element generally made of titanium nitride (TiN) was used to either, quickly heat and quench the glass, making it amorphous, or to hold it in its crystallization temperature range for some time, thereby switching it to a crystalline state. PCM also has the ability to achieve a number of distinct intermediary states, thereby having the ability to hold multiple bits in a single cell. In each of these memory technologies a selecting transistor may be required to energize and select a particular memory cell to perform a read or write operation.

In some memory devices, CMOS transistors may be used as the selecting transistor. However, size limitation of the CMOS transistor technology may be the limiting factor in improving the size and memory cell density of memory devices. The various embodiments described herein improve the size and memory cell density by forming gated ferroelectric memory devices in the BEOL.

FIG. 1A is a vertical cross-sectional view of an exemplary structure after formation of complementary metal-oxide-semiconductor (CMOS) transistors, metal interconnect structures embedded in dielectric material layers, and a connection-via-level dielectric material layer prior to formation of an array of memory structures, according to various embodiments of the present disclosure. Referring to FIG. 1, an exemplary structure according to an embodiment of the present disclosure is illustrated. The exemplary structure includes complementary metal-oxide-semiconductor (CMOS) transistors and metal interconnect structures formed in dielectric material layers. Specifically, the first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). Shallow trench isolation structures 12 including a dielectric material such as silicon oxide may be formed in an upper portion of the substrate 8. Suitable doped semiconductor wells, such as p-type wells and n-type wells, may be formed within each area that may be laterally enclosed by a portion of the shallow trench isolation structures 12. Field effect transistors may be formed over the top surface of the substrate 8. For example, each field effect transistor may include an active source/drain regions 14, a semiconductor channel 15 that includes a surface portion of the substrate 8 extending between the s active source/drain regions 14, and a gate structure 20. Each gate structure 20 may include a gate dielectric 22, a gate electrode strip 24, a gate cap dielectric 28, and a dielectric gate spacer 26. A active source/drain metal-semiconductor alloy region 18 may be formed on each active source/drain region 14. While planar field effect transistors are illustrated in the drawings, embodiments are expressly contemplated herein in which the field effect transistors may additionally or alternatively include fin field effect transistors (FinFET), gate-all-around field effect (GAA FET) transistors, or any other type of field effect transistors (FETs).

The exemplary structure may include a memory array region 50 in which an array of memory elements may be subsequently formed, and a peripheral region 52 in which logic devices that support operation of the array of memory elements may be formed. In one embodiment, devices (such as field effect transistors) in the memory array region 50 may include bottom electrode access transistors that provide access to bottom electrodes of memory cells to be subsequently formed. Top electrode access transistors that provide access to top electrodes of memory cells to be subsequently formed may be formed in the peripheral region 52 at this processing step. Devices (such as field effect transistors) in the peripheral region 52 may provide functions that may be needed to operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a top electrode bias circuitry. The devices formed on the top surface of the substrate 8 may include complementary metal-oxide-semiconductor (CMOS) transistors and optionally additional semiconductor devices (such as resistors, diodes, capacitors, etc.), and are collectively referred to as CMOS circuitry 75.

Various interconnect-level structures may be subsequently formed, which are formed prior to formation of an array of fin back gate field effect transistors and are herein referred to as lower interconnect-level structures (L0, L1, L2). In case a two-dimensional array of TFTs is to be subsequently formed over two levels of interconnect-level metal lines, the lower interconnect-level structures (L0, L1, L2) may include a interconnect-level structure L0, a first interconnect-level structure L1, and a second interconnect-level structure L2. The dielectric material layers may include, for example, a contact-level dielectric material layer 31A, a first metal-line-level dielectric material layer 31B, and a second line-and-via-level dielectric material layer 32. Various metal interconnect structures embedded in dielectric material layers may be subsequently formed over the substrate 8 and the devices (such as field effect transistors). The metal interconnect structures may include device contact via structures 41V formed in the contact-level dielectric material layer 31A (interconnect-level structure L0) and contact a respective component of the CMOS circuitry 75, first metal line structures 41L formed in the first metal-line-level dielectric material layer 31B (interconnect-level structure L1), first metal via structures 42V formed in a lower portion of the second line-and-via-level dielectric material layer 32, second metal line structures 42L formed in an upper portion of the second line-and-via-level dielectric material layer 32 (interconnect-level structure L2).

Each of the dielectric material layers (31A, 31B, and 32) may include a dielectric material such as undoped silicate glass, a doped silicate glass, organosilicate glass, amorphous fluorinated carbon, porous variants thereof, or combinations thereof. Each of the metal interconnect structures (41V, 41L, 42V, and 42L) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 42V and the second metal line structures 42L may be formed as integrated line and via structures by a dual damascene process, and the second metal via structures 43V and the third metal line structures 43L may be formed as integrated line and via structures.

The dielectric material layers (31A, 31B, and 32) may be located at a lower level relative to an array of memory cells to be subsequently formed. As such, the dielectric material layers (31A, 31B, and 32) are herein referred to as lower-level dielectric material layers, i.e., dielectric material layer located at a lower level relative to the array of memory cells to be subsequently formed. The metal interconnect structures (41V, 41L, 42V, and 42L) are herein referred to lower-level metal interconnect structures. A subset of the metal interconnect structures (41V, 41L, 42V, and 42L) includes lower-level metal lines (such as the third metal line structures 42L) that are embedded in the lower-level dielectric material layers and having top surfaces within a horizontal plane including a topmost surface of the lower-level dielectric material layers. Generally, the total number of metal line levels within the lower-level dielectric material layers (31A, 31B, and 32) may be in a range from 1 to 3.

The exemplary structure may include various devices regions, which may include a memory array region 50 in which at least one array of non-volatile memory cells may be subsequently formed. For example, the at least one array of non-volatile memory cells may include resistive random-access memory (RRAM or ReRAM), magnetic/magneto-resistive random-access memory (MRAM), ferroelectric random-access memory (FeRAM), and phase-change memory (PCM) devices. The exemplary structure may also include a peripheral logic region 52 in which electrical connections between each array of non-volatile memory cells and a peripheral circuit including field effect transistors may be subsequently formed. Areas of the memory array region 50 and the logic region 52 may be employed to form various elements of the peripheral circuit.

Referring to FIG. 1B, an array 95 of non-volatile memory cells and TFT selector devices may be formed in the memory array region 50 over the second interconnect-level structure L2. The details for the structure and the processing steps for the array 95 of non-volatile gated ferroelectric memory cells are subsequently described in detail below. A third interconnect level dielectric material layer 33 may be formed during formation of the array 95 of non-volatile gated ferroelectric memory cells. The set of all structures formed at the level of the array 95 of non-volatile memory cells and gated ferroelectric memory cell devices is herein referred to as a third interconnect-level structure L3.

Referring to FIG. 1C, third interconnect-level metal interconnect structures (43V, 43L) may be formed in the third interconnect level dielectric material layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth interconnect level dielectric material layer 34 having formed therein fourth interconnect-level metal interconnect structures (44V, 44L), which may include third metal via structures 44V and fourth metal lines 44L. The fifth interconnect-level structure L5 may include a fifth interconnect level dielectric material layer 35 having formed therein fifth interconnect-level metal interconnect structures (45V, 45L), which may include fourth metal via structures 45V and fifth metal lines 45L. The sixth interconnect-level structure L6 may include a sixth interconnect level dielectric material layer 36 having formed therein sixth interconnect-level metal interconnect structures (46V, 46L), which may include fifth metal via structures 46V and sixth metal lines 46L. The seventh interconnect-level structure L7 may include a seventh interconnect level dielectric material layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each interconnect level dielectric material layer may be referred to as an interconnect level dielectric (ILD) layer 30 (i.e., 31A, 31B, 32, 33, 34, 35, 36, and 37). Each interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 (i.e., 41V, 41L, 42V, 42L, 43V, 43L, 44V, 44L, 45V, 45L, 46V, 46L, 47V, 47B) may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric material layers and dielectric capping layers may be inserted between vertically neighboring pairs of ILD layers 30, or may be incorporated into one or more of the ILD layers 30.

While the present disclosure is described employing an embodiment in which the array 95 of non-volatile memory cells and TFT selector devices may be formed as a component of a third interconnect-level structure L3, embodiments are expressly contemplated herein in which the array 95 of non-volatile memory cells and TFT selector devices may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells and TFT selector devices may be provided within multiple interconnect-level structures in the memory array region 50. While the present disclosure is described employing an embodiment in which an array 95 of non-volatile memory cells and TFT selector devices may be formed in a single interconnect-level structure, embodiments are expressly contemplated herein in which an array 95 of non-volatile memory cells and TFT selector devices may be formed over two vertically adjoining interconnect-level structures.

FIG. 2A is a horizontal cross-sectional view of the exemplary structure after etching and patterning first metal line trenches in the first dielectric material layer according to an embodiment of the present disclosure. FIG. 2B is a vertical cross-sectional view of the exemplary structure along the plane B-B' of FIG. 2A. FIG. 2C is a vertical cross-sectional view of the exemplary structure along the plane A-A' of FIG. 2A. Referring to FIGS. 2A-2C, a first dielectric material layer 120 may be deposited on a substrate 110. The substrate 110 may be any suitable substrate, such as a semiconductor device substrate. In other embodiments, the substrate 110 may be the third interconnect level dielectric material layer 33 as shown in FIG. 1C. The first dielectric material layer 120 may include a dielectric material such as silicon oxide ($SiO_2$), undoped silicate glass, a doped silicate glass, organosilicate glass, amorphous fluorinated carbon, porous variants thereof, or combinations thereof. The first dielectric material layer 120 may be deposited through any of a number of suitable deposition process or grown over ILD layer 30. A photoresist layer (not shown) may be applied over the first dielectric material layer 120 and may be patterned to form trenches 121 within areas of the first dielectric material layer 120 where first metal lines may be subsequently formed. For example, the photoresist pattern may be formed by depositing a photoresist material and then patterning the deposited photoresist material using photolithography. The patterned photoresist may mask portions of the first dielectric material layer 120 to protect these portions in a subsequent etch process. An etch process may be performed to form first metal line trenches 121 in the first dielectric material layer 120. For example, the first dielectric material layer 120 may be etched using any suitable etching process, such as a wet or dry etching process. In one embodiment, each first metal line trench 121 can be located within an upper portion of the first dielectric material layer 120. The first metal line trenches 121 can laterally extending along a first horizontal direction hd1, and can be laterally spaced apart along a second horizontal direction hd2 that is perpendicular to the first horizontal direction hd1. The photoresist may then be removed, for example, by ashing or a chemical process.

FIG. 3A is a horizontal cross-sectional view of the exemplary structure after depositing and planarizing a conductive metal material in the first metal line trench to form first metal lines according to an embodiment of the present disclosure. FIG. 3B is a vertical cross-sectional view of the exemplary structure along the plane B-B' of FIG. 3A. FIG. 3C is a vertical cross-sectional view of the exemplary structure along the plane A-A' of FIG. 3A. Referring to FIGS. 3A-3C, first metal lines 122 may be formed in the first metal line trenches 121. An electrically conductive material may be deposited over the first dielectric material layer 120 in order to fill the first metal line trenches 121. The first metal lines 122 may be formed from an electrically conductive metal material such as, copper, aluminum, zirconium, titanium, titanium nitride, tungsten, tantalum, tantalum nitride, ruthenium, palladium, platinum, cobalt, nickel, iridium, alloys thereof, or the like. Other suitable electrically conductive materials for the first metal lines 122 are within the contemplated scope of disclosure. The first metal lines 122 (also referred to as plate lines or source lines 122) may be formed by depositing a layer of conductive material using any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

A planarization process, such as a chemical mechanical polishing (CMP) process or the like, may then be performed to remove excess electrically conductive metal material from the surface of the first dielectric material layer 120 and to render the top surface of first metal lines 122 co-planar with the top surface of the first dielectric material layer 120. In one embodiment, each first metal line 122 may be located within an upper portion of the first dielectric material layer 120. The first metal lines 122 may laterally extend along a first horizontal direction hd1, and can be laterally spaced apart along the second horizontal direction hd2 that is perpendicular to the first horizontal direction hd1.

FIG. 4A is a vertical cross-sectional view of the exemplary structure along a first horizontal direction hd1 (i.e., plane B-B') after depositing a number of layers including a ferroelectric dielectric layer 130 and a semiconductor channel material layer 140L over the first metal lines 122 and substrate 110 according to an embodiment of the present disclosure. FIG. 4B is a vertical cross-sectional view of the exemplary structure along a second horizontal direction hd2 (i.e., plane A-A') after depositing a number of layers including a ferroelectric dielectric layer 130 and a semiconductor channel material layer 140L over the first metal lines 122 and substrate 110 according to an embodiment of the present disclosure. Referring to FIGS. 4A and 4B, a blanket layer of ferroelectric (FE) material 130 may be deposited over the first dielectric material layer 120 and the first metal lines 122. The ferroelectric (FE) dielectric layer 130 may be formed of any suitable ferroelectric material, such as, $HfO_2$, $ZrO_2$, $HfZrO_2$, AlScN, $PbZrO_3$, $Pb[Zr_xTi_{1-x}]O_3$, ($0 \leq x \leq 1$) (PZT), $BaTiO_3$, $PbTiO_3$, $PbNb_2O_6$, $LiNbO_3$, $LiTaO_3$, polyvinylidene fluoride (PVDF), potassium dihydrogen phosphate (KDP), $PbMg_{1/3}Nb_{2/3}O_3$ (PMN), $PbSc_{1/2}Ta_{1/2}O_3PbSc_{1/2}Ta_{1/2}O_3$ (PST), $SrBi_2Ta_2O_9$ (SBT), $Bi_{1/2}Na_{1/2}TiO_3Bi_{1/2}Na_{1/2}TiO_3$, combinations thereof, or the like. In particular, the ferroelectric dielectric layer 130 may be deposited on the first dielectric material layer 120, so as to cover the first metal lines 122.

A semiconductor material layer 140L may be deposited on the ferroelectric dielectric layer 130. The semiconductor material layer 140L may include polysilicon, amorphous silicon, or a semiconducting oxide, such as InGaZnO (IGZO), indium tin oxide (ITO), InWO, InZnO, InSnO, GaOx, InOx, or the like. Other suitable semiconductor materials are within the scope of the present disclosure. In some embodiments, the pillar semiconductor channels 140 may preferably be formed of IGZO. The IGZO may be "intrinsic," or may include dopants as necessary. The conductivity range of the semiconductor material layer 140L may be at least from $1\times10^{-5}$ S/m to 1 S/m, and may be from $1\times10^{-10}$ S/m to $1\times120$ S/m, although greater or lesser conductivities may be within the contemplated scope of disclosure. The semiconductor material layer 140L may allow for a gated ferroelectric memory cells to be subsequently formed to control and select a memory cell formed from the underlying ferroelectric dielectric layer 130. The semiconductor material layer 140L may deposited using any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

Figure 5A:
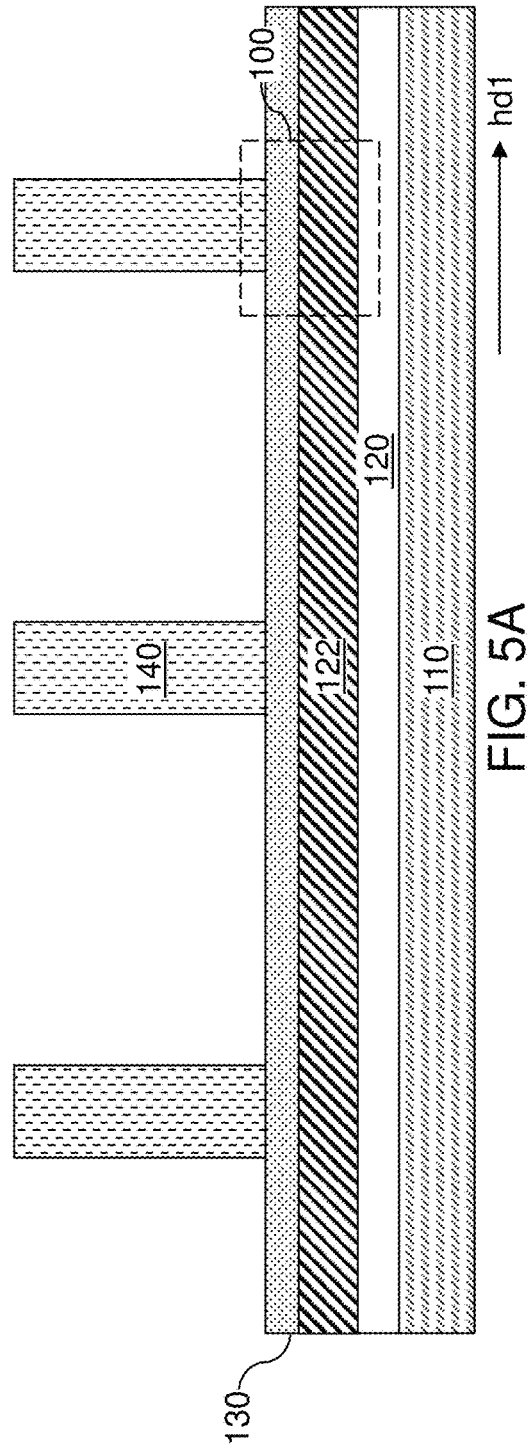
FIG. 5A is a vertical cross-sectional view of the exemplary structure along a first horizontal direction hd1 (i.e., plane B-B') after etching and patterning pillar semiconductor channels of a gated ferroelectric memory cell according to an embodiment of the present disclosure.
Figure 5B:
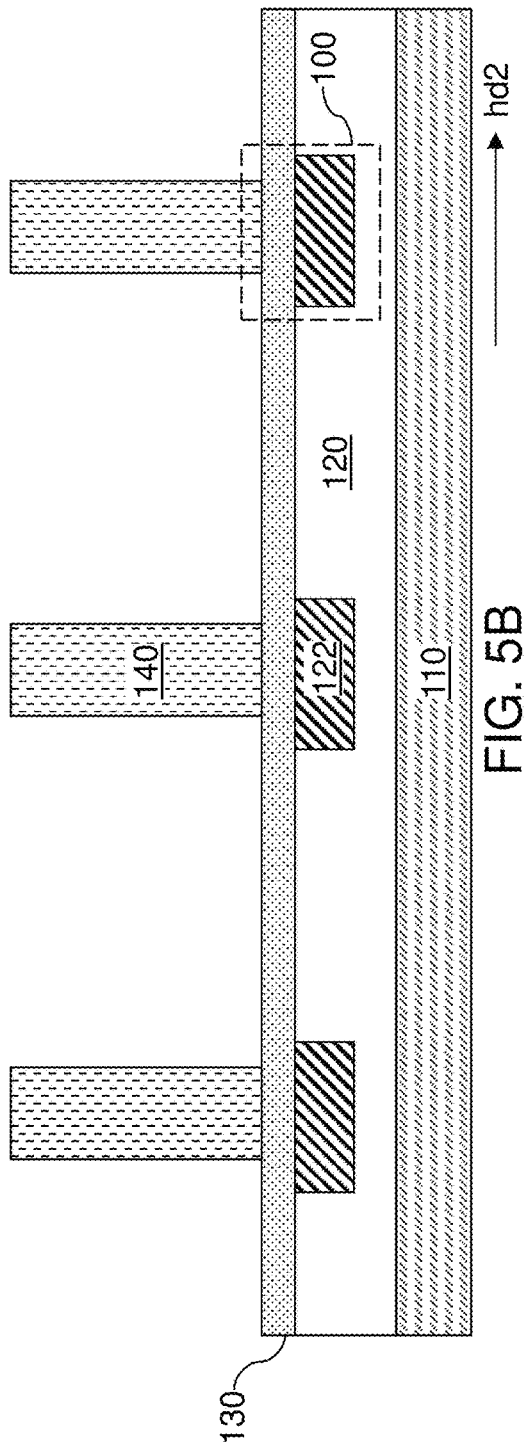
FIG. 5B is a vertical cross-sectional view of the exemplary structure along a second horizontal direction hd2 (i.e., plane A-A') after etching and patterning pillar semiconductor channels of a gated ferroelectric memory cell according to an embodiment of the present disclosure.

FIG. 5A is a vertical cross-sectional view of the exemplary structure along a first horizontal direction hd1 (i.e., plane B-B') after etching and patterning pillar semiconductor channels of a gated ferroelectric memory cell according to an embodiment of the present disclosure. FIG. 5B is a vertical cross-sectional view of the exemplary structure along a second horizontal direction hd2 (i.e., plane A-A') after etching and patterning pillar semiconductor channels of a gated ferroelectric memory cell according to an embodiment of the present disclosure. Referring to FIGS. 5A and 5B, the semiconductor material layer 140L may be patterned to form pillar semiconductor channel 140. For example, a two-dimensional array of etch mask material such as a photoresist material (not shown) may be applied over the semiconductor material layer 140L. A photolithography process may transfer a pattern over the photoresist material. By anisotropically etching unmasked portions of the semiconductor channel material layer 140 selective to the ferroelectric dielectric layer 130 employing the two-dimensional array of etch mask material portions as an etch mask, the remaining portions of the semiconductor channel material layer 140 may be patterned to comprise the two-dimensional array of pillar semiconductor channels. Generally, a two-dimensional array of pillar semiconductor channels 140 can be formed over the ferroelectric dielectric layer 130. Each row of pillar semiconductor channels 140 is formed over, and is capacitively coupled to, a respective one of the first metal lines 122.

The resulting pillar semiconductor channel 140 may be in the form of a column, pillar, or a nanowire. However, the pillar semiconductor channels 140 are not limited to any particular shape. The pillar semiconductor channel 140 may be vertically aligned with respect to the first dielectric material layer 120. In other words, a long axis of each pillar semiconductor channel 140 may extend perpendicular to a plane of the first dielectric material layer 120 and/or an underlying semiconductor substrate. After the pillar semiconductor channel 140 is formed, the photoresist material (not shown) may be removed, for example, by ashing or a chemical process.

After the pillar semiconductor channel structures 140 may be formed, a two-dimensional array of memory cells 100 may be provided. Each memory cell 100 may include a bottom portion of a pillar semiconductor channel 140, a portion of the ferroelectric dielectric layer 130 having an areal overlap with the pillar semiconductor channel 140, and a portion of a first metal line 122 having an areal overlap with the pillar semiconductor channel 140. Thus, the memory cell 100 may be a metal-ferroelectric-semiconductor (MFS) capacitor. As discussed below, the memory cell 100 may also include a metal-ferroelectric-metal capacitor. Still further, other memory cell structures 100 may be within the contemplated scope of disclosure. For example, the memory cell 100 may be formed as a PCM, ReRAM, MRAM or other suitable memory cell structure.

FIG. 6A is a vertical cross-sectional view of the exemplary structure along a first horizontal direction hd1 (i.e., plane B-B') after depositing a gate dielectric layer over the formed pillar semiconductor channels of the gated ferroelectric memory cell according to an embodiment of the present disclosure. FIG. 6B is a vertical cross-sectional view of the exemplary structure along a second horizontal direction hd2 (i.e., plane A-A') after depositing a gate dielectric layer over the formed pillar semiconductor channels of the gated ferroelectric memory cell according to an embodiment of the present disclosure. Referring to FIGS. 6A and 6B, a gate dielectric layer may be conformally deposited over the ferroelectric dielectric layer 130 and the two-dimensional array of pillar semiconductor channels 140. The gate dielectric layer 150 may be deposited on the ferroelectric dielectric layer 130, so as to cover the pillar semiconductor channels 140. The gate dielectric layer 150 may be formed of any suitable dielectric material such as silicon oxide or a high-k dielectric material. Herein, "high-k dielectric materials" have a dielectric constant greater than 3.9 and may include, but are not limited to, silicon nitride, hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O2$) (HZO)), tantalum oxide ($Ta_2O_5$), aluminum oxide ($Al_2O_3$), hafnium dioxide-alumina ($HfO_2$—$Al_2O_3$), zirconium oxide ($ZrO_2$). Other suitable dielectric materials are within the scope of the present disclosure.

The gate dielectric layer 150 may be formed by any suitable deposition method. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

In various embodiments, the gate dielectric layer 150 may have a thickness $t_{hk}$ in the range of 0.5-5.0 nm, such as 1-4 nm, although greater or lesser thicknesses may be used. In various embodiments, the pillar semiconductor channel 140 may have a thickness $t_c$ in the range of 1-20 nm, such as 3-15 nm, although greater or lesser thicknesses may be used.

Portions of the gate dielectric layer 150 may extend vertically (e.g., perpendicular to a plane of the first dielectric material layer 120) from the first dielectric material layer 120 and form surrounding gate insulators (SGIs) 150A (see FIGS. 16D and 17B) that respectively surround the pillar semiconductor channel 140.

Figure 7B:
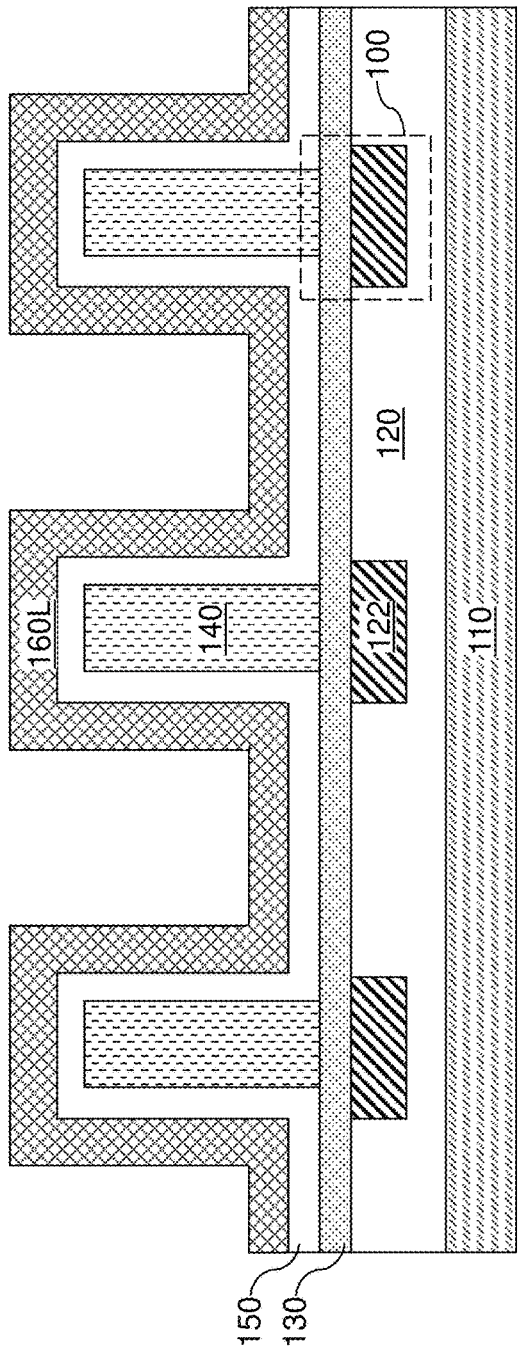
FIG. 7B is a vertical cross-sectional view of the exemplary structure along a second horizontal direction hd2 (i.e., plane A-A') after depositing conductive metal material layer over the formed pillar semiconductor channels and gate dielectric layer of the gated ferroelectric memory cell according to an embodiment of the present disclosure.
Figure 7A:
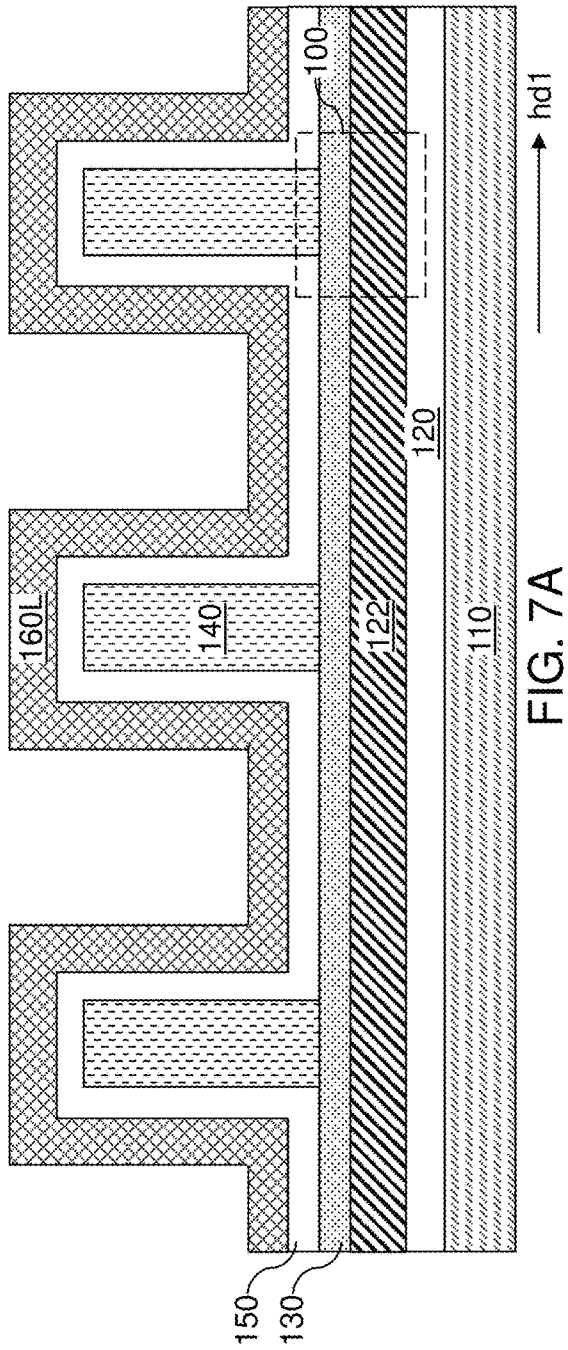
FIG. 7A is a vertical cross-sectional view of the exemplary structure along a first horizontal direction hd1 (i.e., plane B-B') after depositing conductive metal material layer over the formed pillar semiconductor channels and gate dielectric layer of the gated ferroelectric memory cell according to an embodiment of the present disclosure.

FIG. 7A is a vertical cross-sectional view of the exemplary structure along a first horizontal direction hd1 (i.e., plane B-B') after depositing conductive metal material layer as a gate electrode and word line over the formed pillar semiconductor channels and gate dielectric layer of the gated ferroelectric memory cell according to an embodiment of the present disclosure. FIG. 7B is a vertical cross-sectional view of the exemplary structure along a second horizontal direction hd2 (i.e., plane A-A') after depositing conductive metal material layer as a gate electrode and word line over the formed pillar semiconductor channels and gate dielectric layer of the gated ferroelectric memory cell according to an embodiment of the present disclosure. Referring to FIGS. 7A and 7B, a gate electrode material layer 160L may be deposited on the gate dielectric layer 150 by a conformal or non-conformal deposition process. The gate electrode material layer 160L may be formed from an electrically conductive metal material such as, copper, aluminum, zirconium, titanium, titanium nitride, tungsten, tantalum, tantalum nitride, ruthenium, palladium, platinum, cobalt, nickel, iridium, alloys thereof, or the like. Other suitable electrically conductive materials for the gate electrode material layer 160L are within the contemplated scope of disclosure. The gate electrode material 160L may be deposited using any suitable electrically conductive material, such as a gate metal, using any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

Figure 8A:
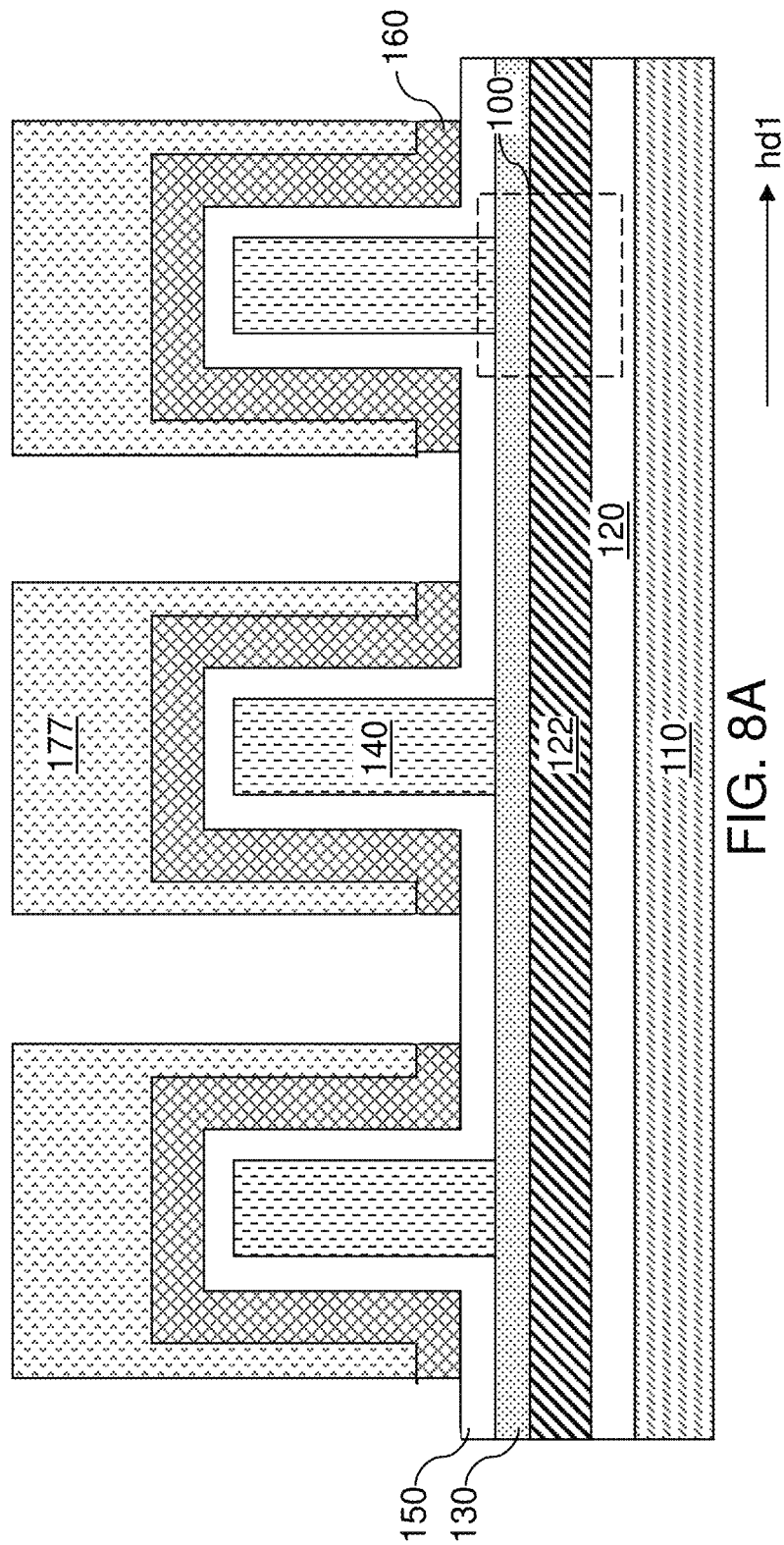
FIG. 8A is a vertical cross-sectional view of the exemplary structure along a first horizontal direction hd1 (i.e., plane B-B') after patterning the conductive metal material layer to form word lines and gate electrodes of the gated ferroelectric memory cell according to an embodiment of the present disclosure.
Figure 8B:
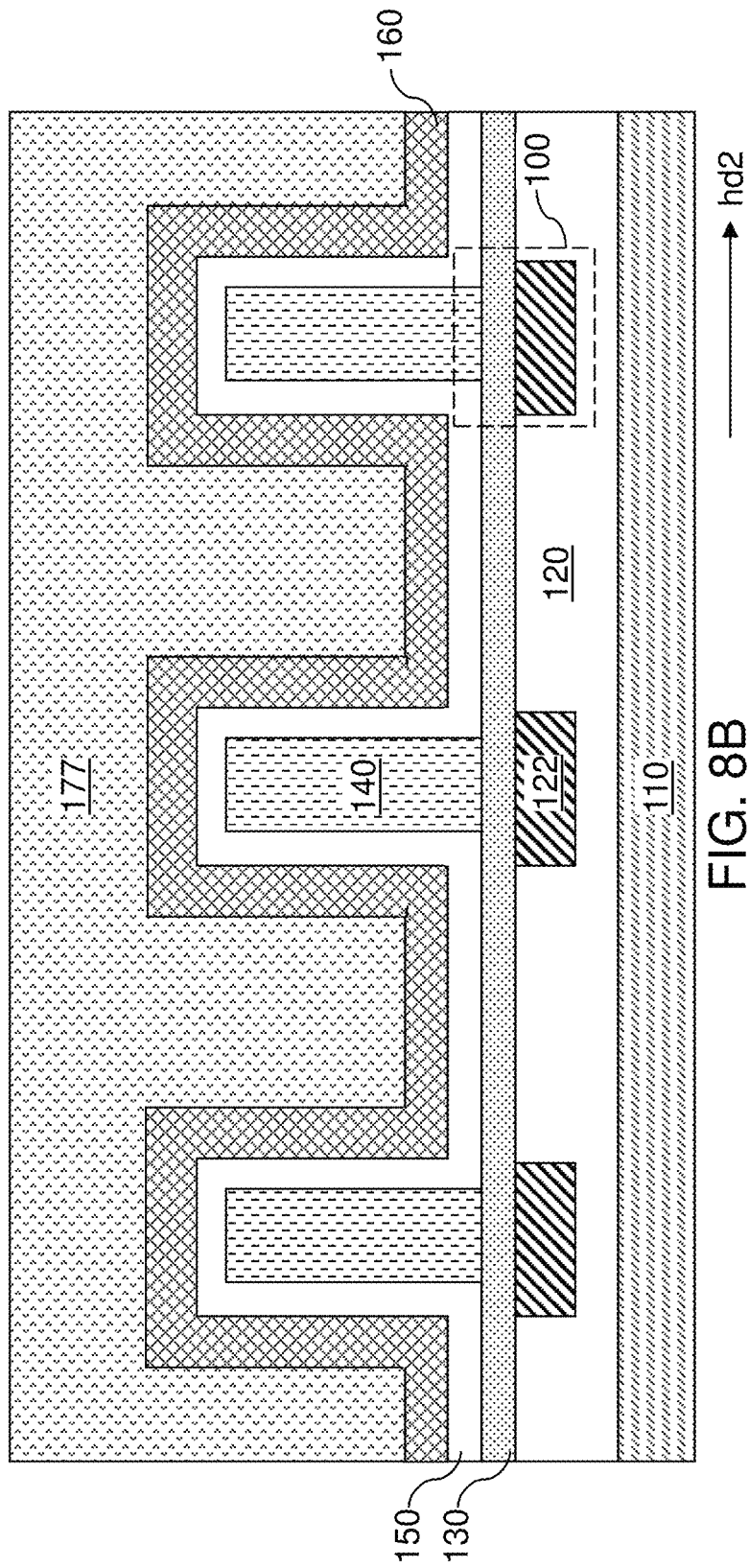
FIG. 8B is a vertical cross-sectional view of the exemplary structure along a second horizontal direction hd2 (i.e., plane A-A') after patterning the conductive metal material layer to form word lines and gate electrodes of the gated ferroelectric memory cell according to an embodiment of the present disclosure.

FIG. 8A is a vertical cross-sectional view of the exemplary structure along a first horizontal direction hd1 (i.e., plane B-B') after patterning the conductive metal material layer to form word lines and gate electrodes of the gated ferroelectric memory cell according to an embodiment of the present disclosure. FIG. 8B is a vertical cross-sectional view of the exemplary structure along a second horizontal direction hd2 (i.e., plane A-A') after patterning the conductive metal material layer to form word lines and gate electrodes of the gated ferroelectric memory cell according to an embodiment of the present disclosure.

Referring to FIGS. 8A and 8B, the gate electrode material layer 160L may be patterned to form gate electrodes 160 as well as a gate electrode strip. For example, a two-dimensional array of etch mask material such as a photoresist material 177 may be applied over the semiconductor material layer 160L overlying the respective column of pillar semiconductor channels 140. A photolithography process may transfer a pattern over the photoresist material 177. By anisotropically etching unmasked portions of the gate electrode material layer 160L employing the two-dimensional array of photoresist material 177 as an etch mask, the remaining portions of the gate electrode material layer 140 may be patterned to comprise the gate electrode strips 160 that may surround the respective pillar semiconductor channels 140 and gate dielectric layer 150 as well as gate electrode strips 160 that may function as word lines. The gate electrode strip 160 may be formed as a gate-all-around (GAA) gate to laterally surround the pillar semiconductor channel 140, thereby providing better gate control. The photoresist layer material 177 may be subsequently removed, for example, by ashing.

Figure 9A:
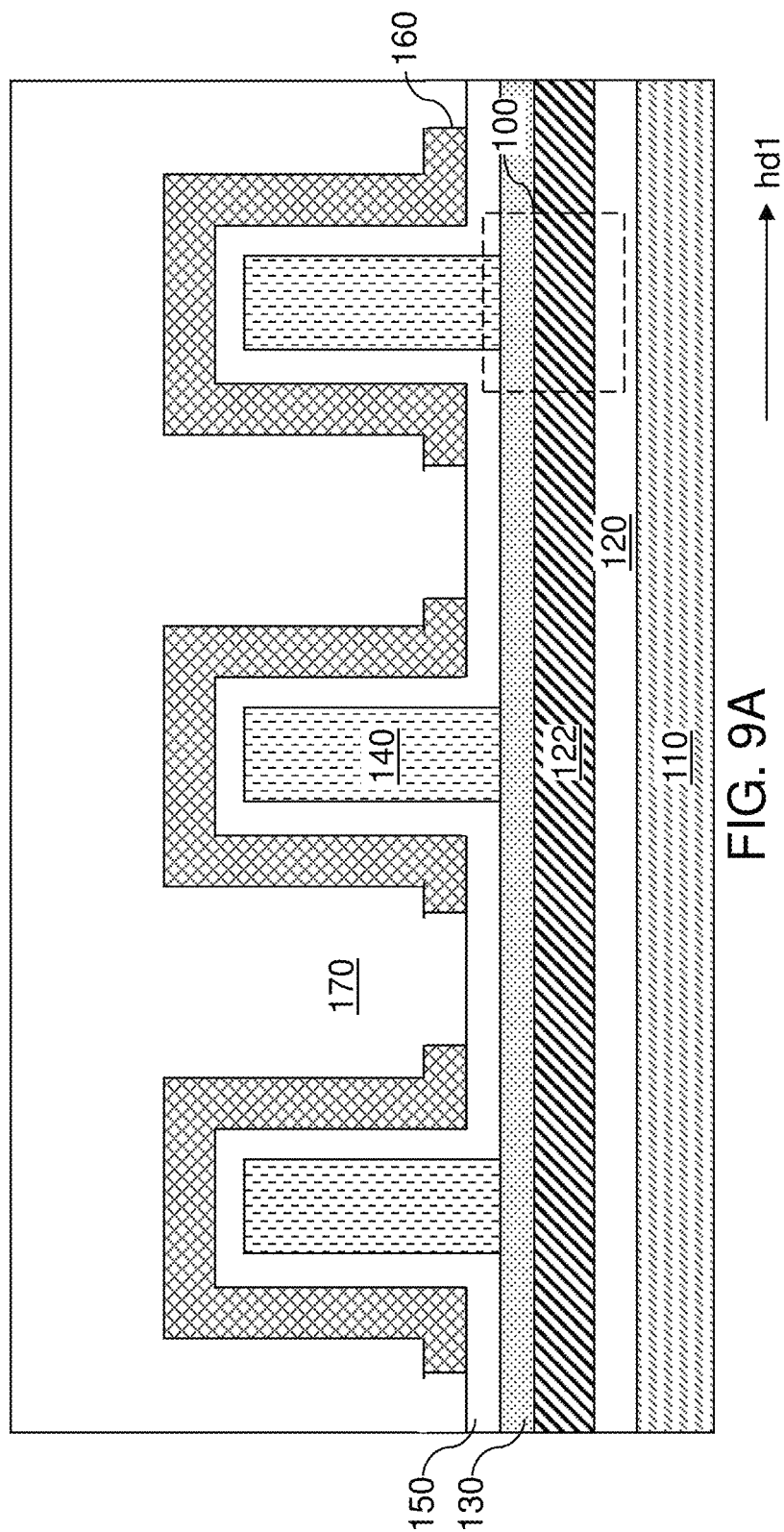
FIG. 9A is a vertical cross-sectional view of the exemplary structure along a first horizontal direction hd1 (i.e., plane B-B') after deposition of a first dielectric material layer over the field-controlled vertical current switch according to an embodiment of the present disclosure.
Figure 9B:
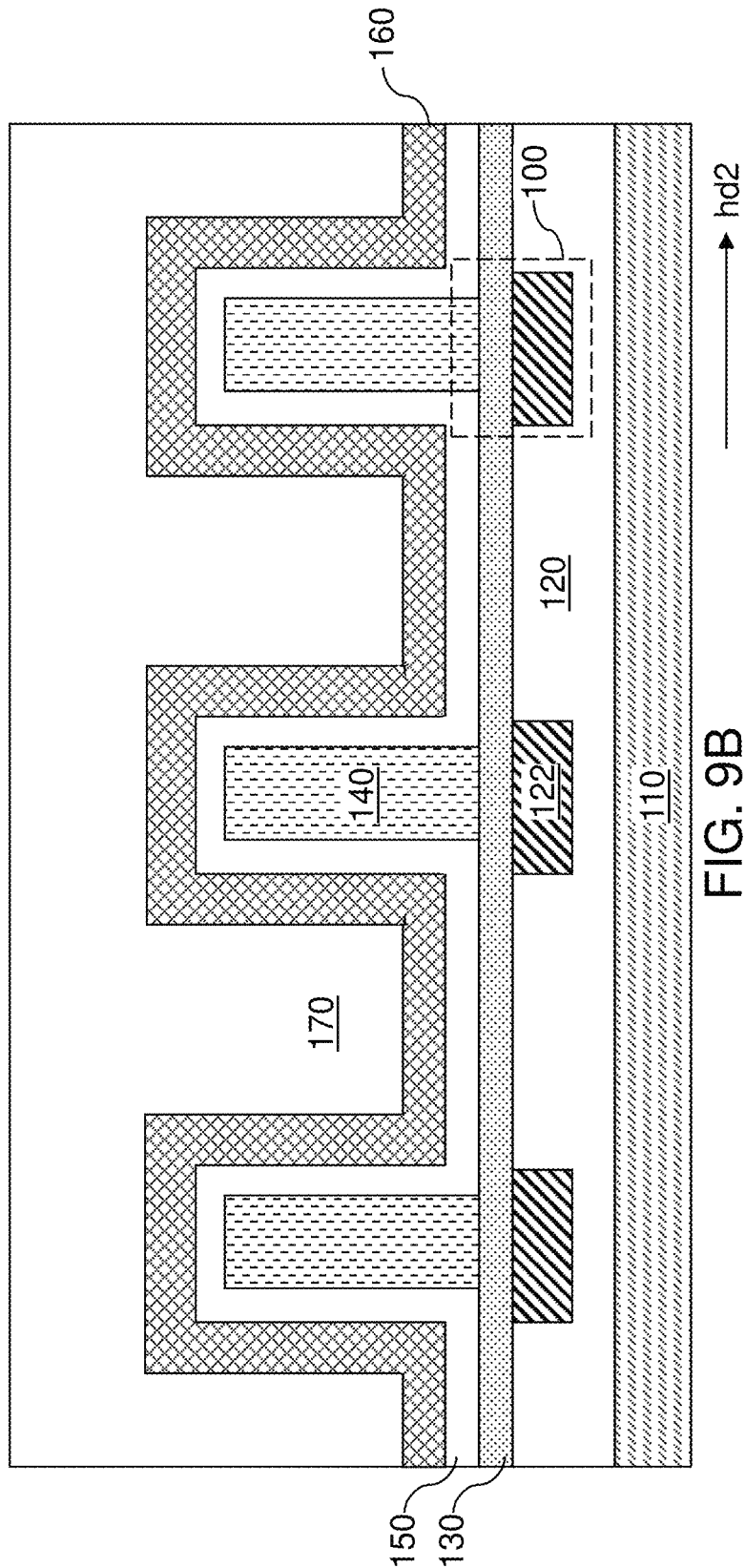
FIG. 9B is a vertical cross-sectional view of the exemplary structure along a second horizontal direction hd2 (i.e., plane A-A') after deposition of a first dielectric material layer over the field-controlled vertical current switch according to an embodiment of the present disclosure.

FIG. 9A is a vertical cross-sectional view of the exemplary structure along a first horizontal direction hd1 (i.e., plane B-B') after deposition of a first dielectric material layer over the field-controlled vertical current switch according to an embodiment of the present disclosure. FIG. 9B is a vertical cross-sectional view of the exemplary structure along a second horizontal direction hd2 (i.e., plane A-A') after deposition of a first dielectric material layer over the field-controlled vertical current switch according to an embodiment of the present disclosure. Referring to FIGS. 9A and 9B, a dielectric matrix layer 170 may be deposited so as to embed the pillar semiconductor channel 140, the gate dielectric layers 150, the gate electrode strips 160.

The dielectric matrix layer 170 may be formed of silicon oxide or any suitable high-k dielectric material. Dielectric matrix layer 170 may be formed from the same material as the first dielectric material layer 120, or may be different. The dielectric matrix layer 170 may be formed using any suitable deposition process.

FIG. 10A is a vertical cross-sectional view of the exemplary structure along a first horizontal direction hd1 (i.e., plane B-B') after planarizing the conductive metal material layer, gate dielectric layer and pillar semiconductor channels of the gated ferroelectric memory cell according to an embodiment of the present disclosure. FIG. 10B is a vertical cross-sectional view of the exemplary structure along a second horizontal direction hd2 (i.e., plane A-A') after planarizing the conductive metal material layer, gate dielectric layer and pillar semiconductor channels of the gated ferroelectric memory cell according to an embodiment of the present disclosure. Referring to FIGS. 10 A and 10B, a planarization process, such as CMP, may be performed to planarize the upper surfaces of the pillar semiconductor channel 140, the gate dielectric layer 150 and the gate electrode strips 160 such that top surfaces of the pillar semiconductor channel 140, gate dielectric layer 150 and the gate electrode strips 160 are co-planar. In particular, portions of the dielectric matrix layer 170, the gate electrode strips 160, and the gate dielectric layer 150 may be removed from above the horizontal plane including the top surfaces of the pillar semiconductor channels 140. Subsequent to the planarization operation, each pillar semiconductor channel 140 within the two-dimensional array of pillar semiconductor channels 140 may have a respective top surface located within a horizontal plane including a planarized top surface of the dielectric matrix layer 170. In addition, each gate electrode strip 160 may have an annular top surface 161 that is located within the horizontal plane including the planarized top surface of the dielectric matrix layer 170.

FIG. 11A is a vertical cross-sectional view of the exemplary structure along a first horizontal direction hd1 (i.e., plane B-B') after a selective etch process to vertically recess a top annular portion of the gate electrode strip of the field-controlled vertical current switch according to an embodiment of the present disclosure. FIG. 11B is a vertical cross-sectional view of the exemplary structure along a second horizontal direction hd1 (i.e., plane A-A') after a selective etch process to vertically recess a top annular portion of the gate electrode strip of the field-controlled vertical current switch according to an embodiment of the present disclosure. Referring to FIGS. 11A and 11B, a selective etch process may be performed to vertically recess each annular top surface of the gate electrode strips 160 relative to the planarized top surface of the dielectric matrix layer 170 and top surfaces of the two-dimensional array of pillar semiconductor channels 140. The etch process etches the gate electrode material selective to both the gate electrode strip 160 material and the dielectric matrix layer 170. The etch process may include an isotropic etch process such as a wet etch process, or an anisotropic etch process such as a reactive ion etch process. The recess depth of the gate electrode strips 160 may result in a gate electrode 160 that surrounds the pillar semiconductor channel 140 to a height of 60%-90% of the height of each pillar semiconductor channel 140. Put another way, the recess depth of the etch process may be in a range from 10% to 40% of the height of each pillar semiconductor channel 140. As a result of the etch process that vertically recesses the gate electrode 160, annular cavities 171 may be formed.

FIG. 12A is a vertical cross-sectional view of the exemplary structure along a first horizontal direction hd1 (i.e., plane B-B') after deposition of a conductive metal material to form a bit line of the field-controlled vertical current switch according to an embodiment of the present disclosure. FIG. 12B is a vertical cross-sectional view of the exemplary structure along a second horizontal direction hd1 (i.e., plane A-A') after deposition of a conductive metal material to form a bit line of the field-controlled vertical current switch according to an embodiment of the present disclosure. Referring to FIGS. 12A and 12B, annular cavities 171 may be filled with the dielectric material of a second dielectric material layer 180 upon deposition of the second dielectric material layer 180. For example, a conformal deposition process (such as a chemical vapor deposition process) may be employed to deposit the second dielectric material layer 180. In such an embodiment case, the second dielectric material layer 180 may include a two-dimensional array of tubular dielectric material portions 172 that fill the cylindrical cavities 171 and contact an annular top surface of a respective tubular portion of the gate electrode strips 160T.

A photoresist material (not shown) may be applied over the second dielectric material layer 180. The photoresist material may be patterned through photolithography techniques to mask the second dielectric material layer 180 to form line trenches (not shown) laterally extending along the first horizontal direction hd1 in the second dielectric material layer 180 after an etch process. The line trenches may be filled with at least one metallic fill material. Each metallic fill material portion may be any suitable electrically conductive electrode material, such as, copper, aluminum, zirconium, titanium, titanium nitride, tungsten, tantalum, tantalum nitride, ruthenium, palladium, platinum, cobalt, nickel, iridium, alloys thereof, or the like. Other suitable second metal line materials are within the contemplated scope of disclosure. The second metal lines 182 may be formed by depositing a layer of conductive material using any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like. In some embodiments an optional metallic liner material may be deposited prior to the metallic fill portion. Each metallic liner layer may include TiN, TaN, WN, TiC, TaC, and WC. Other suitable materials within the contemplated scope of disclosure may also be used. Excess portions of the at least one metallic material may be removed from above the horizontal plane including the top surface of the second dielectric material layer 180 employing a planarization process such as chemical mechanical polishing process.

Each remaining portion of the at least one metallic material filling a respective line trench in the second dielectric material layer 180 comprises a second metal line 182 that may operate as an effective bit line. Each of the second metal lines 182 may be formed directly on a respective row of top surfaces of the pillar semiconductor channels 140. Thus, second metal lines 182 may be formed over the two-dimensional array of pillar semiconductor channels 140, wherein each of the second metal lines 182 is formed directly on top surfaces of a respective row of pillar semiconductor channels 140. As noted above, in other embodiments, a metallic liner (not shown) may be used to improve the electrical coupling between the second metal lines 182 and the pillar semiconductor channels 140.

In this manner, a gated ferroelectric memory cell 200 may be provided above each memory cell 100. The gated ferroelectric memory cell 200 may include a pillar semiconductor channel 140 and a portion of a gate electrode strip 160 that laterally surrounds the pillar semiconductor channel 140. A two-dimensional array of gated ferroelectric memory cells 200 is provided. Each gated ferroelectric memory cell 200 includes a series connection of a memory element 100, a field-controlled vertical current switch 600, and a metallic top electrode that is a portion of a second metal line 182. Thus, each gated ferroelectric memory cell 200 includes a metallic bottom electrode that may be a portion of a first metal line 122, a portion of a ferroelectric dielectric layer 130, a pillar semiconductor channel 140, a portion of a gate dielectric layer 150, a portion of a gate electrode strip 160, and a metallic top electrode that is a portion of a second metal line 182.

FIG. 13A is a vertical cross-sectional view of a second alternative embodiment structure along a first horizontal direction hd1 (i.e., plane B-B') after depositing a number of layers including a ferroelectric dielectric layer, a metal top electrode layer and a semiconductor channel material layer over the first metal lines and substrate according to an embodiment of the present disclosure. FIG. 13B is a vertical cross-sectional view of the second alternative embodiment structure along a first horizontal direction hd1 (i.e., plane B-B') after depositing a number of layers including a ferroelectric dielectric layer, a metal top electrode layer and a semiconductor channel material layer over the first metal lines and substrate according to an embodiment of the present disclosure. Referring to FIGS. 13A and 13B, an intermediate structure as shown in FIGS. 3A-3C may be provided. As above, a blanket layer of ferroelectric (FE) material 130 may be deposited over the first dielectric material layer 120 and the first metal lines 122. The ferroelectric (FE) dielectric layer 130 may be formed of any suitable ferroelectric material, such as, $HfO_2$, $ZrO_2$, $HfZrO_2$, AlScN, $PbZrO_3$, $Pb[Zr_xTi_{1-x}]O_3$, ($0 \leq x \leq 1$) (PZT), $BaTiO_3$, $PbTiO_3$, $PbNb_2O_6$, $LiNbO_3$, $LiTaO_3$, polyvinylidene fluoride (PVDF), potassium dihydrogen phosphate (KDP), $PbMg_{1/3}Nb_{2/3}O_3$ (PMN), $PbSc_{1/2}Ta_{1/2}O_3 PbSc_{1/2}Ta_{1/2}O_3$ (PST), $SrBi_2Ta_2O_9$ (SBT), $Bi_{1/2}Na_{1/2}TiO_3 Bi_{1/2}Na_{1/2}TiO_3$, combinations thereof, or the like. In particular, the ferroelectric dielectric layer 130 may be deposited on the first dielectric material layer 120, so as to cover the first metal lines 122.

A semiconductor material layer 140L may be deposited on the ferroelectric dielectric layer 130. The semiconductor material layer 140L may include polysilicon, amorphous silicon, or a semiconducting oxide, such as InGaZnO (IGZO), indium tin oxide (ITO), InWO, InZnO, InSnO, GaOx, InOx, or the like. Other suitable semiconductor materials are within the scope of the present disclosure. In some embodiments, the pillar semiconductor channels 140 may preferably be formed of IGZO. The IGZO may be "intrinsic," or may include dopants as necessary. The conductivity range of the semiconductor material layer 140L may be at least from $1\times10^{-5}$ S/m to 1 S/m, and may be from $1\times10^{-10}$ S/m to $1\times120$ S/m, although greater or lesser conductivities may be within the contemplated scope of disclosure. The semiconductor material layer 140L may allow for a gated ferroelectric memory cell to be subsequently formed to control and select a memory cell formed from the underlying ferroelectric dielectric layer 130. The semiconductor material layer 140L may deposited using any suitable deposition process. In addition, an intermediate metallic electrode 142L may be deposited between the semiconductor material layer 140L and the ferroelectric dielectric layer 130. The intermediate metallic electrode 142L may be formed from materials such as, copper, aluminum, zirconium, titanium, titanium nitride, tungsten, tantalum, tantalum nitride, ruthenium, palladium, platinum, cobalt, nickel, iridium, alloys thereof, or the like. Other suitable electrically conductive materials for the intermediate metallic electrode 142L are within the contemplated scope of disclosure. In such alternative embodiments, the intermediate metallic electrode 142L may be subsequently patterned into a two-dimensional array of intermediate metallic electrodes employing the two-dimensional array of etch mask material portions as an etch mask. The intermediate metallic electrode 142L may be patterned to form a top metal plate 142 over the ferroelectric dielectric layer 130 in a metal-ferroelectric-metal capacitor memory cell.

FIG. 14A is a vertical cross-sectional view of the second alternative embodiment structure along a first horizontal direction hd1 (i.e., plane B-B') after etching and patterning pillar semiconductor channels of a gated ferroelectric memory cell according to an embodiment of the present disclosure. FIG. 14B is a vertical cross-sectional view of the second alternative embodiment structure along a second horizontal direction hd2 (i.e., plane A-A') after etching and patterning pillar semiconductor channels of a gated ferroelectric memory cell according to an embodiment of the present disclosure. Referring to FIGS. 14A and 14B, and similar to the steps described above with respect to FIGS. 5A and 5B, the semiconductor material layer 140L may be patterned to form pillar semiconductor channel 140. By anisotropically etching unmasked portions of the semiconductor channel material layer 140 selective to the ferroelectric dielectric layer 130 employing the two-dimensional array of etch mask material portions as an etch mask, the remaining portions of the semiconductor channel material layer 140 may be patterned to comprise the two-dimensional array of pillar semiconductor channels. Generally, a two-dimensional array of pillar semiconductor channels 140 can be formed over the ferroelectric dielectric layer 130. Each row of pillar semiconductor channels 140 is formed over, and is capacitively coupled to, a respective one of the first metal lines 122. In addition, as shown in FIGS. 14A and 14B, the etch process that patterns the pillar semiconductor channel 140 may also etch and pattern the intermediate metallic electrode 142L to form top metal plate 142 between the pillar semiconductor channel 140 and the ferroelectric dielectric layer 130, as shown in FIG. 4B. As such, the top metal plate 142, ferroelectric dielectric layer 130 and first metal line 122 may be used to form a metal-ferro-metal junction memory cell device. Such memory cell devices may have improved memory endurance and retention time. After the pillar semiconductor channel 140 is formed, the photoresist material (not shown) may be removed, for example, by ashing or a chemical process.

FIG. 15A is a vertical cross-sectional view of the second alternative embodiment structure along a first horizontal direction hd1 (i.e., plane B-B') after deposition of a conductive metal material to form a bit line of the field-controlled vertical current switch according to an embodiment of the present disclosure. FIG. 15B is a vertical cross-sectional view of the second alternative embodiment structure along a second horizontal direction hd1 (i.e., plane A-A') after deposition of a conductive metal material to form a bit line of the field-controlled vertical current switch according to an embodiment of the present disclosure. Referring to FIGS. 15A and 15B, the process steps as described above with respect to FIGS. 6A-12B may performed. Thus, an alternative gated ferroelectric memory cell 601 may be provided above each memory cell 101. A two-dimensional array of memory cells 101 may be provided. Each memory cell 101 may include a bottom portion of a pillar semiconductor channel 140, a portion of the ferroelectric dielectric layer 130 having an areal overlap with the pillar semiconductor channel 140, and an intermediate metallic layer that forms a top electrode 142.

The gated ferroelectric memory cell 601 may include a pillar semiconductor channel 140 and a portion of a gate electrode strip 160 that laterally surrounds the pillar semiconductor channel 140. A two-dimensional array of gated ferroelectric memory cells 201 is provided. Each gated ferroelectric memory cell 201 includes a series connection of a memory element 101, a gated ferroelectric memory cell 601, and a metallic top electrode that is a portion of a second metal line 182. Thus, each gated ferroelectric memory cell 201 includes a metallic bottom electrode that may be a portion of a first metal line 122, a portion of a ferroelectric dielectric layer 130, a top electrode 142, a pillar semiconductor channel 140, a portion of a gate dielectric layer 150, a portion of a gate electrode strip 160, and a metallic top electrode that is a portion of a second metal line 182.

Figure 16B:
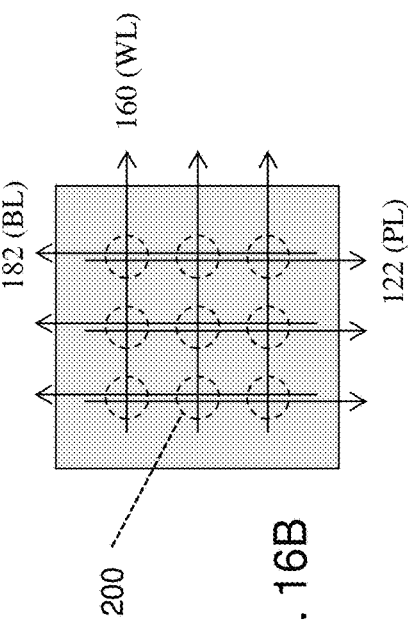
FIG. 16B is a top schematic view of the exemplary semiconductor memory device of FIG. 16A.
Figure 16A:
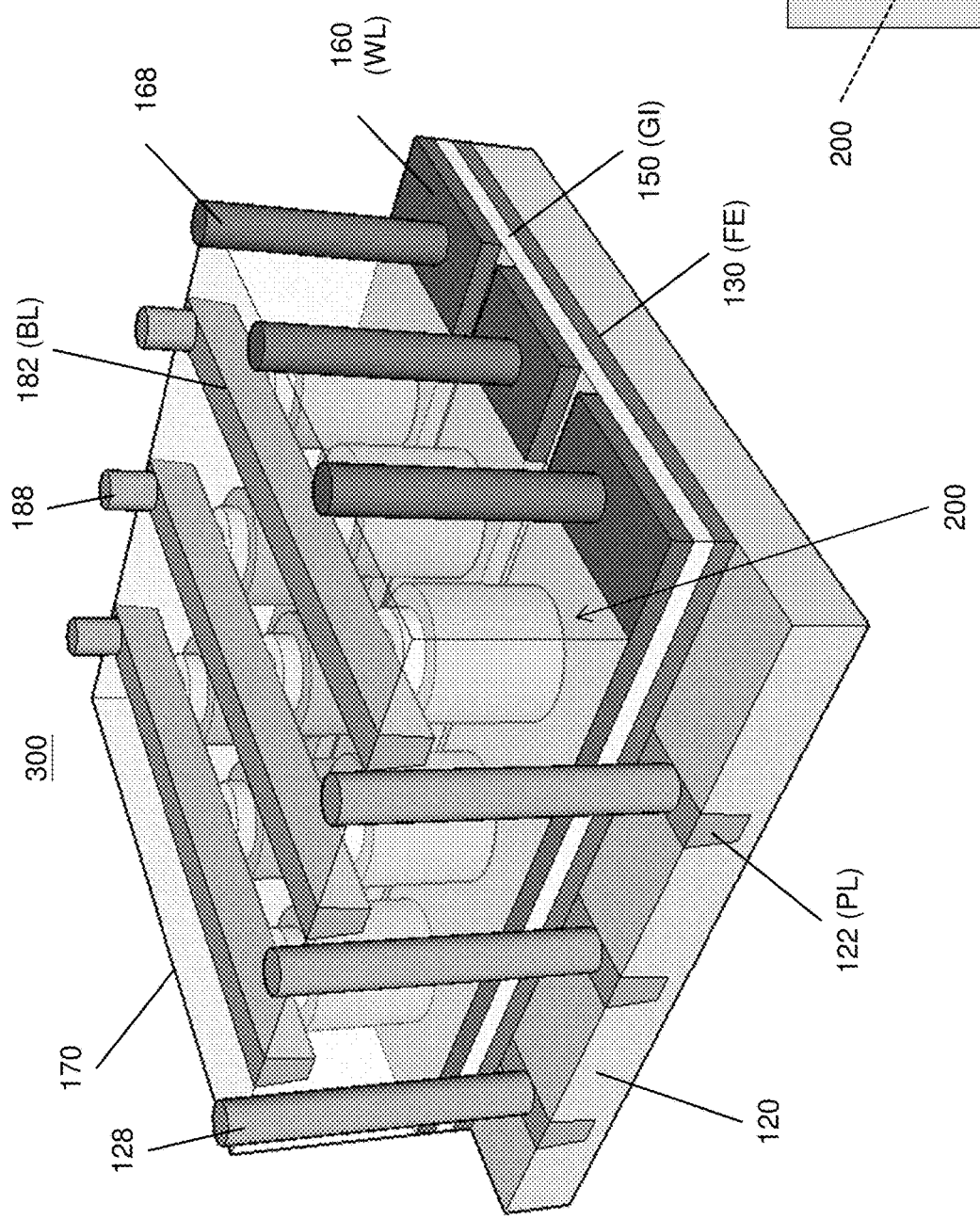
FIG. 16A is a partial perspective view of the exemplary semiconductor memory device according to various embodiments of the present disclosure.

FIG. 16A is a partial perspective view of a semiconductor memory device according to various embodiments of the present disclosure. FIG. 16B is a top schematic view of the semiconductor memory device of FIG. 16A. FIG. 16C is a cross-sectional partial perspective view of the semiconductor memory device of FIG. 16A, taken through memory structures of the semiconductor memory device. FIG. 16D is an enlarged cross-sectional view of a portion P of FIG. 16C. FIG. 17A is a vertical partial cross-sectional perspective view of a semiconductor memory device according to another embodiment of the present disclosure. FIG. 17B is an enlarged cross-sectional view of a portion P of FIG. 17A.

For example, FIG. 16A may illustrate a perspective view of a completed two-dimensional array 300 of gated ferroelectric memory cells 200 as shown in FIGS. 12A and 12B. The two-dimensional array 300 of gated ferroelectric memory cells 200 includes a two-dimensional array of field-controlled vertical current switches 600. Each gated ferroelectric memory cell 200 may include a field-controlled vertical current switch 600 formed over and coupled to a memory element (100, 101) (see FIGS. 12A, 12B, 15A, 15B, 16D and 17B). The field-controlled vertical current switch 600 includes a gate electrode strips 160 and gate dielectric layer 150 that surrounds a pillar semiconductor channel 140. A distal end 140S of the pillar semiconductor channel 140 may be electrically coupled to a second metal line 182. A proximal end 140D of the pillar semiconductor channel 140 may be electrically coupled in series to a memory element 100, 101.

The memory element 100, 101 may include a metal-ferroelectric-metal (MFM) capacitor or a metal-ferroelectric-semiconductor (MFS) capacitor memory element 100. For example, with reference to FIGS. 12A, 12B, and 16D, in an embodiment, the memory element 100 may include a metal-ferroelectric-semiconductor (MFS) capacitor ferroelectric tunnel junction operating as a capacitor or ferroelectric tunnel junction memory cell. As shown in FIGS. 12A, 12B, and 16D, a ferroelectric dielectric layer 130 may be disposed between an electrically conductive metal first metal line 122 and pillar semiconductor channel 140. In such an embodiment, a bottom portion of the pillar semiconductor channel 140 may operate as a top electrode of the capacitor or FTJ memory device. A top portion of first metal line 122 may operate as a bottom electrode of the capacitor or FTJ memory device. First metal line 122 may be coupled to a first metal line via 128 that may extends vertically through the interconnection dielectric layers.

In another embodiment as illustrated in FIGS. 15A, 15B, 17A, and 17B, a completed two-dimensional array 301 of gated ferroelectric memory cells 201 may be provided. The two-dimensional array 301 of gated ferroelectric memory cells 201 is similar to the two-dimensional array 300 of gated ferroelectric memory cells 200 shown in FIG. 16A. However, in the two-dimensional array 301 of gated ferroelectric memory cells 201, an intermediate metallic electrode 142 may be formed between the ferroelectric dielectric layer 130 and the pillar semiconductor channel 140. In such an embodiment, metal-ferroelectric-metal (MFM) capacitor may be formed using a top portion of the first metal line 122 as a bottom metal plate, the ferroelectric dielectric layer 130 as an inter-node dielectric, and the intermediate metallic electrode 142 as a top metal plate. The intermediate metallic electrode 142 may be electrically coupled in series with the pillar semiconductor channel 140.

Referring to FIGS. 1A-12B and 16A-16D, collectively and according to various embodiments of the present disclosure, a semiconductor device 300 may be provided that includes at least one gated ferroelectric memory cell 200, 201 wherein each of the gated ferroelectric memory cell 200, 201 includes a dielectric material layer 120 disposed over a substrate 110. The memory cell 200, 201 further includes a metallic bottom electrode 122 and a ferroelectric dielectric layer 130 contacting a top surface of the metallic bottom electrode 122. The gated ferroelectric memory cell 200, 201 further includes a pillar semiconductor channel 140 overlying the ferroelectric dielectric layer 130 and capacitively coupled to the metallic bottom electrode 122 through the ferroelectric dielectric layer 130. As shown in FIGS. 12A, 12B, 15A and 15B, the gated ferroelectric memory cell 200, 201 further includes a gate dielectric layer 150 comprising a horizontal gate dielectric portion 150H overlying the ferroelectric dielectric layer 130 and a tubular gate dielectric portion 150T laterally surrounding the pillar semiconductor channel 140. The gated ferroelectric memory cell 200 further includes a gate electrode strip 160 overlying the horizontal gate dielectric portion 150H and laterally surrounding the tubular gate dielectric portion 150T. As shown in FIGS. 12A, 12B, 15A and 15B, the gated ferroelectric memory cell 200, 201 further includes a gate electrode strip 160 comprising a horizontal gate electrode strip portion 160H overlying the horizontal gate dielectric portion 150H and a tubular gate electrode strip portion 160T portion laterally surrounding the tubular gate dielectric portion 150T. The horizontal portion of gate electrode strip 160H may be coupled to a gate electrode via 168 that may extend vertically through the interconnection dielectric layers. The gated ferroelectric memory cell 200, 201 further includes a metallic top electrode 182 contacting a top surface of the pillar semiconductor channel 140. Metallic top electrode 182 may be coupled to a metallic top electrode via 188 that may extend vertically through the interconnection dielectric layers.

In various embodiments, the pillar semiconductor channel 140 of the memory cell 200 may include a bottom surface in contact with a top surface of the ferroelectric dielectric layer 130; and the gated ferroelectric memory cell 200 comprises a metal-ferroelectric-semiconductor (MFS) capacitor 100.

In one embodiment of the semiconductor device 301, an intermediate metallic electrode 142 contacts a bottom surface of the pillar semiconductor channel 140 and a top surface of the ferroelectric dielectric layer 130; and the gated ferroelectric memory cell 201 comprises a metal-ferroelectric-metal (MFM) capacitor 101.

In one embodiment of the semiconductor device 301, a periphery of a top surface of the intermediate metallic electrode 142 coincides with a periphery of the bottom surface of the pillar semiconductor channel 140.

In one embodiment of the semiconductor device 300, the horizontal gate dielectric portion 150H and the tubular gate dielectric portion 150T may be connected portions of a continuously extending dielectric material layer 150 and have a same thickness and a same material composition.

In one embodiment of the semiconductor device 300, the gate electrode strip 160 comprises a horizontal gate electrode strip portion 160H and a tubular gate electrode strip portion 160T that may be connected portions of a continuously extending gate electrode strip material and a same material composition.

In one embodiment of the semiconductor device 300, an annular top surface of the tubular gate dielectric portion 150T is located within a same horizontal plane as the top surface of the pillar semiconductor channel 140.

In one embodiment of the semiconductor device 300, the tubular gate electrode strip portion 160T comprises an annular top surface 161 that is vertically spaced from the top electrode 182 by a uniform vertical spacing.

In one embodiment of the semiconductor device 300, the semiconductor device 300 may include at least one row of gated ferroelectric memory cells 200, wherein each of the gated ferroelectric memory cells 200 within each row of gated ferroelectric memory cells may be arranged along a first horizontal direction. In addition, metallic bottom electrodes 122 of each row of gated ferroelectric memory cells 200 comprise portions of a respective first metal line 122 that laterally extend along the first horizontal direction; and metallic top electrodes of each row of gated ferroelectric memory cells comprise portions of a respective second metal line 182 that laterally extend along the second horizontal direction.

In one embodiment, the semiconductor device 300 may include a two-dimensional array of gated ferroelectric memory cells, wherein the two-dimensional array of gated ferroelectric memory cells 200 comprises a plurality of columns of gated ferroelectric memory cells 200 and a plurality of rows of gated ferroelectric memory cells 200. Each row of gated ferroelectric memory cells 200 may comprise a respective set of gated ferroelectric memory cells that are arranged along the first horizontal direction with a first periodicity. Each column of gated ferroelectric memory cells 200 may comprise a respective set of gated ferroelectric memory cells that are arranged along the second horizontal direction with a second periodicity. Furthermore, each column of gated ferroelectric memory cells 200 may comprise a gate electrode strip 160, wherein the gate electrode strips 160 may comprise a respective portion of a continuously extending gate electrode strip material that laterally surrounds each pillar semiconductor channel 140 within the column of gated ferroelectric memory cells 200.

In this manner, the various embodiments may provide a FeRAM device (200, 300) that may be fabricated in BEOL with a field-controlled vertical current switch 600 that may select a memory element 100. The memory element 100 may include a MFM or a MFS capacitor. By forming both the memory element 100 and field-controlled vertical current switch 600 that may select a memory element 100 in BEOL, the memory density may be increased by leveraging the smaller area required to form the field-controlled vertical current switch 600 that may select a memory element 100. In addition, the field-controlled vertical current switch 600 may be directly coupled to the memory element 100. As such, the gated ferroelectric memory cell 200 including the field-controlled vertical current switch 600 in direct contact with a memory element 100 has a more compact configuration, as compared to other configurations. For example, other configurations may include transistors disposed below word lines or to the side of memory cells. As such, the gated ferroelectric memory cell 200 may allow for a higher memory cell density than conventional memory structures.

Still further the GAA gate electrode strip 160 that laterally surrounds the pillar semiconductor channel 140 provide better gate control. Application of a voltage to the GAA gate electrode strip 160 may selectively control current flow to the memory element 100. The gate electrode strips 160 may provide a gate voltage to the field-controlled vertical current switch 600 for controlling current flow through the pillar semiconductor channel 140 and to the memory element 100.

Each memory element 100 may include a ferroelectric dielectric layer 130 that provides a tunnel barrier. Accordingly, the memory elements 100 may be referred to as FE memory cells. In various embodiments, a portion of the pillar semiconductor channel 140 (e.g., drain side of the channel) directly contacts the ferroelectric dielectric layer 130 and may operate as the top electrode, a portion of the first metal line 122 may operate as the bottom electrode, and a portion of the ferroelectric dielectric layer 130 may operate as the FE tunnel barrier.

In various embodiments, the memory element 100 may operate as a ferroelectric tunneling junction (FTJ). In particular, the FE tunnel barrier may be a ferroelectric film that is thin enough to allow tunneling of electrons there through. For example, the FE tunnel barrier 130 may be about 1 nanometer (nm) to about 50 nm thick, such as from about 5 nm to about 25 nm, or about 10 nm thick.

According to another embodiment of the present disclosure, a semiconductor device 300 is provided that comprises at least one two-dimensional array of gated ferroelectric memory cells 200, wherein each of the at least one two-dimensional array of gated ferroelectric memory cells 200 comprises: first metal lines 122 embedded in a first dielectric material layer 120 and laterally extending along a first horizontal direction; a ferroelectric dielectric layer 130 continuously extending over the first metal lines 122; a two-dimensional array of pillar semiconductor channels 140 overlying the ferroelectric dielectric layer 130, wherein each row of pillar semiconductor channels 140 is arranged along the first horizontal direction and is capacitively coupled to a respective one of the first metal lines 122; a gate dielectric layer 150 comprising a horizontal gate dielectric portion overlying the ferroelectric dielectric layer 130 and a tubular gate dielectric portion laterally surrounding the pillar semiconductor channels 140; gate electrode strips 160 laterally surrounding a respective column of pillar semiconductor channels 140 that are arranged along the second horizontal direction and laterally spaced apart among one another along the first horizontal direction; and second metal lines 182 embedded in a second dielectric material layer 180, laterally extending along the first horizontal direction, and contacting top surfaces of a respective row of pillar semiconductor channels 140.

In one embodiment, the pillar semiconductor channel 140 of the semiconductor device 300 contacts a top surface of the ferroelectric dielectric layer 130. In another embodiment, each of the at least one two-dimensional arrays of gated ferroelectric memory cells 201 comprises a two-dimensional array of intermediate metallic electrodes 142 in contact with the ferroelectric dielectric layer 130 and with a respective pillar semiconductor channel 140 within the two-dimensional array of pillar semiconductor channels 140.

Figure 18:
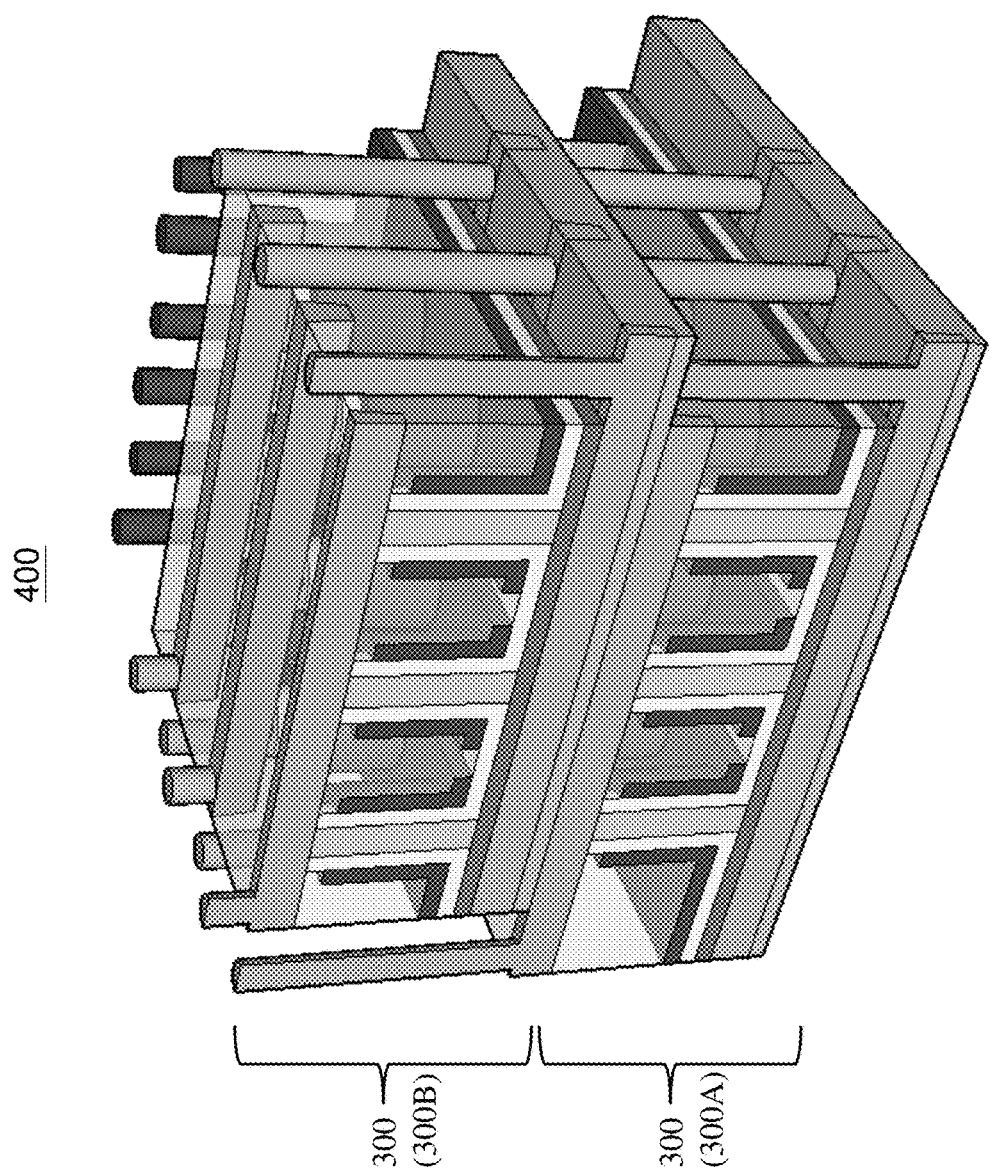
FIG. 18 is a partial cross-sectional perspective view of a semiconductor memory device according to another embodiment of the present disclosure.

FIG. 18 is a partial cross-sectional perspective view of a semiconductor memory device 400, according to various embodiments of the present disclosure. Referring to FIG. 18, the memory device 400 includes a first two-dimensional array 300A of gated ferroelectric memory cells and a second two-dimensional array 300B of gated ferroelectric memory cells that are vertically stacked. Each of the first and second two-dimensional arrays (300A, 300B) of gated ferroelectric memory cells may the same as any of the two-dimensional array 300 of gated ferroelectric memory cells described above. Thus, in an embodiment of the semiconductor device 300, at least one two-dimensional array of gated ferroelectric memory cells comprises a plurality of two-dimensional arrays of gated ferroelectric memory cells 300A, 300B located over a common substrate and vertically stacked along a vertical direction that is perpendicular to a top surface of the common substrate 110.

The semiconductor memory device 400 may be include multiple two-dimensional arrays of gated ferroelectric memory cells, such as those shown in FIGS. 1A-17B. As such, the semiconductor memory device 400 may provide an increased memory density, as compared to a memory device that includes only a single memory device layer. While two two-dimensional arrays 300 of gated ferroelectric memory cells (200 or 201) are shown in FIG. 18, the memory device 400 may include additional two-dimensional arrays 300 of gated ferroelectric memory cells (200 or 201), such as 3 to 20 interconnect memory layers. The compact configuration of each single memory layer provides a further increase in memory density.

Figure 19:
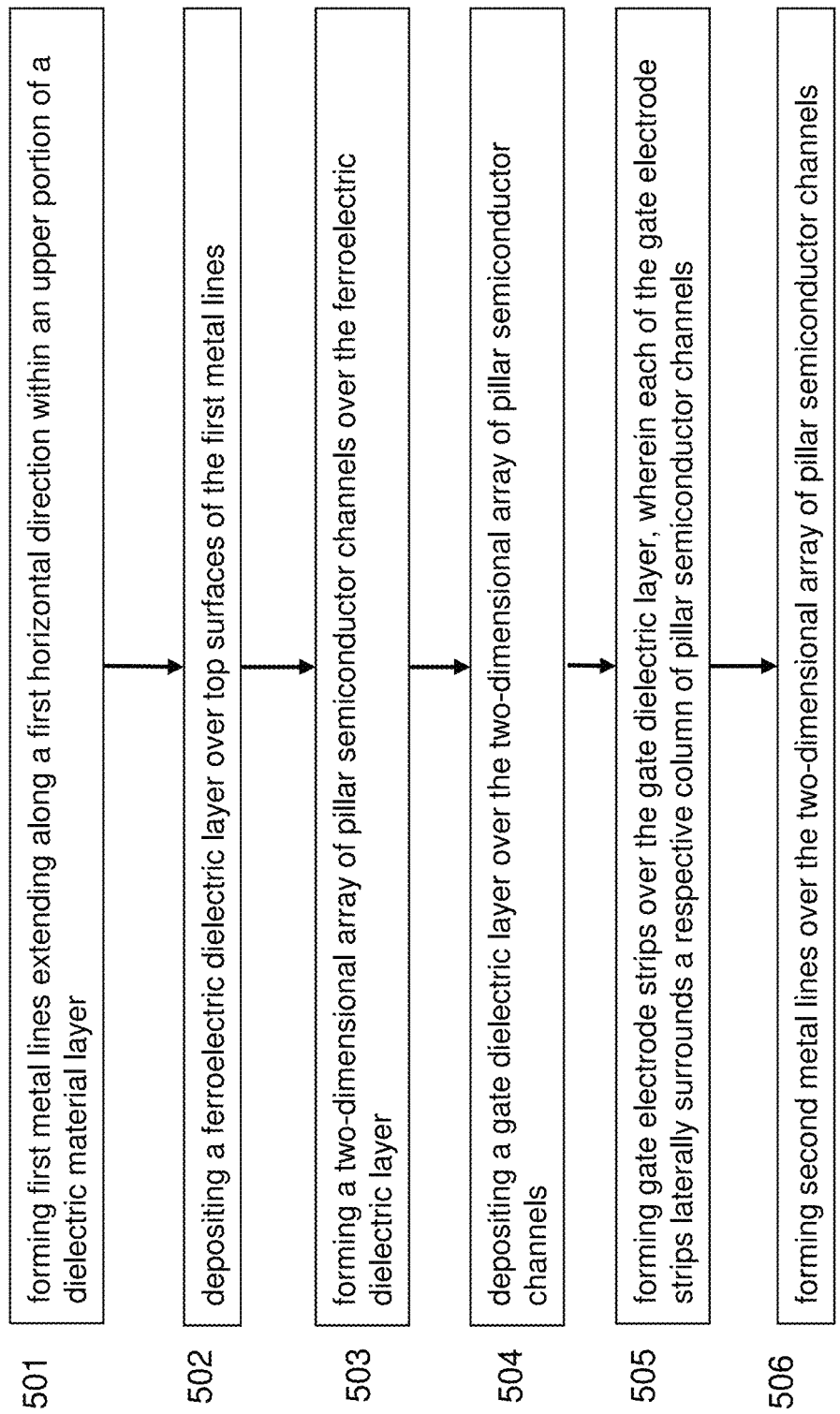
FIG. 19 is a flow chart including the steps for form a semiconductor memory device according to various embodiments of the present disclosure.

FIG. 19 is a flow chart including the steps for form a semiconductor memory device 300, 301, 400, according to various embodiments of the present disclosure. Referring to FIGS. 2A-2C and 19, in operation 501, first metal lines 122 extending along a first horizontal direction may be formed within an upper portion of a dielectric material layer 120. Referring to FIGS. 3A-3C and 19, in operation 502, a ferroelectric dielectric layer 130 may be deposited over top surfaces of the first metal lines 122. Referring to FIGS. 4A-5B, and 19, in operation 503, a two-dimensional array of pillar semiconductor channels 140 may be formed over the ferroelectric dielectric layer 130, wherein each row of pillar semiconductor channels 140 is formed over, and is capacitively coupled to, a respective one of the first metal lines 122. Referring to FIGS. 6A, 6B and 19, in operation 504 a gate dielectric layer 150 may be deposited over the two-dimensional array of pillar semiconductor channels 140. Referring to FIGS. 7A-11 A and 19, in operation 505, gate electrode strips 160 may be formed over the gate dielectric layer 150, wherein each of the gate electrode strips 160 laterally surrounds a respective column of pillar semiconductor channels 140. Referring to FIGS. 12A, 12B and 19, in operation 506 second metal lines 182 may be formed over the two-dimensional array of pillar semiconductor channels 140, wherein each of the second metal lines 182 may be formed directly on top surfaces of a respective row of pillar semiconductor channels 140.

According to various embodiments, provided are memory structures and devices that provide a higher memory cell density than prior memory configurations. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A gated ferroelectric memory cell comprising:
a metallic bottom electrode;
a ferroelectric dielectric layer contacting a top surface of the metallic bottom electrode;
a pillar semiconductor channel overlying the ferroelectric dielectric layer and capacitively coupled to the metallic bottom electrode through the ferroelectric dielectric layer;
a gate dielectric layer comprising a horizontal gate dielectric portion overlying the ferroelectric dielectric layer and a tubular gate dielectric portion laterally surrounding the pillar semiconductor channel; and
a gate electrode strip laterally surrounding the tubular gate dielectric portion.

2. The semiconductor device of claim 1, wherein:
the pillar semiconductor channel comprises a bottom surface in contact with a top surface of the ferroelectric dielectric layer; and
the gated ferroelectric memory cell comprises a metal-ferroelectric-semiconductor (MFS) capacitor.

3. The semiconductor device of claim 1, wherein:
an intermediate metallic electrode contacts a bottom surface of the pillar semiconductor channel and a top surface of the ferroelectric dielectric layer; and
the gated ferroelectric memory cell comprises a metal-ferroelectric-metal (MFM) capacitor.

4. The semiconductor device of claim 3, wherein a periphery of a top surface of the intermediate metallic electrode coincides with a periphery of the bottom surface of the pillar semiconductor channel.

5. The semiconductor device of claim 1, wherein the horizontal gate dielectric portion and the tubular gate dielectric portion are connected portions of a continuously extending dielectric material layer and have a same thickness and a same material composition.

6. The semiconductor device of claim 1, wherein the horizontal gate electrode strip portion and the tubular gate electrode strip portion are connected portions of a continuously extending gate electrode strip material and have a same material composition.

7. The semiconductor device of claim 6, wherein the tubular gate electrode strip portion comprises an annular top surface that is vertically spaced from the top electrode by a uniform vertical spacing.

8. The semiconductor device of claim 1, wherein an annular top surface of the tubular gate dielectric portion is located within a same horizontal plane as the top surface of the pillar semiconductor channel.

9. The semiconductor device of claim 1, further comprising:
a metallic top electrode contacting a top surface of the pillar semiconductor channel;
a dielectric material layer in which the metallic bottom electrode is embedded; and
a substrate supporting the dielectric material layer.

10. A semiconductor device comprising at least one gated ferroelectric memory cell comprising:
a metallic bottom electrode;
a ferroelectric dielectric layer contacting a top surface of the metallic bottom electrode;
a pillar semiconductor channel capacitively coupled to the bottom electrode through the ferroelectric dielectric layer;
a gate dielectric layer overlying the ferroelectric dielectric layer and laterally surrounding the pillar semiconductor channel;
a gate electrode strip overlying the gate dielectric layer and laterally surrounding the pillar semiconductor channel;
a dielectric matrix covering the gate electrode strips; and
a metallic top electrode contacting a top surface of the pillar semiconductor channel.

11. The semiconductor device of claim 10, wherein the gate dielectric layer comprises:
a horizontal gate dielectric portion overlying the ferroelectric dielectric layer; and
a tubular gate dielectric portion laterally surrounding the pillar semiconductor channel.

12. The semiconductor device of claim 11, wherein the gate electrode strip comprises:
a horizontal gate electrode portion overlying the horizontal gate dielectric portion; and
a tubular gate electrode portion laterally surrounding the tubular gate dielectric portion.

13. The semiconductor device of claim 12, further comprising an upper dielectric material layer disposed on the dielectric matrix and in which the metallic top electrode is embedded.

14. The semiconductor device of claim 13, wherein the dielectric material layer comprises a tubular dielectric material portion that contacts an annular top surface of the tubular gate electrode portion and that surrounds a portion of the tubular gate dielectric portion.

15. The semiconductor device of claim 10, further comprising an intermediate metallic electrode that electrically connects the ferroelectric dielectric layer and the pillar semiconductor channel.

16. The semiconductor device of claim 10, further comprising a lower dielectric material layer in which the metallic bottom electrodes are embedded.

17. A semiconductor device comprising a first array of gated ferroelectric memory cells comprising:
first metal lines laterally extending along a first horizontal direction; a ferroelectric dielectric layer continuously extending over the first metal lines; pillar semiconductor channels disposed on the ferroelectric dielectric layer and capacitively coupled to the first metal lines;

a gate dielectric layer disposed on the ferroelectric dielectric layer 430 and laterally surrounding the pillar semiconductor channels;

gate electrode strips laterally surrounding a respective column of pillar semiconductor channels that are arranged along the second horizontal direction and laterally spaced apart among one another along the first horizontal direction and second metal lines laterally extending along the first horizontal direction and contacting top surfaces of a respective row pillar semiconductor channels.

18. The semiconductor device of claim 17, wherein each pillar semiconductor channel in the first array of pillar semiconductor channels contacts a top surface of the ferroelectric dielectric layer.

19. The semiconductor device of claim 18, wherein the first array of gated ferroelectric memory cells comprises an of intermediate metallic electrodes in contact with the ferroelectric dielectric layer and with a respective pillar semiconductor channel within the two-dimensional array of pillar semiconductor channels.

20. The semiconductor device of claim 17, further comprising:

a second array of gated ferroelectric memory cells vertically stacked on the first array of gated ferroelectric memory cells; and a substrate supporting the first array of gated ferroelectric memory cells.

\* \* \* \* \*